(12) United States Patent
Usami

(10) Patent No.: US 8,039,963 B2
(45) Date of Patent: Oct. 18, 2011

(54) SEMICONDUCTOR DEVICE HAVING SEAL RING STRUCTURE

(75) Inventor: Tatsuya Usami, Kanagawa (JP)

(73) Assignee: Renesas Electronics Corporation, Kawasaki-shi, Kanagawa (JP)

( * ) Notice: Subject to any disclaimer, the term of this patent is extended or adjusted under 35 U.S.C. 154(b) by 436 days.

(21) Appl. No.: 12/219,527

(22) Filed: Jul. 23, 2008

(65) Prior Publication Data

US 2009/0051011 A1 Feb. 26, 2009

(30) Foreign Application Priority Data

Aug. 22, 2007 (JP) .................. 2007-216217

(51) Int. Cl.
*H01L 23/40* (2006.01)
(52) U.S. Cl. ................. 257/758; 257/E23.001
(58) Field of Classification Search .......... 257/758, 257/760, 773, 774, E23.001, E23.141, E23.145
See application file for complete search history.

(56) References Cited

U.S. PATENT DOCUMENTS

| 5,861,670 | A | * | 1/1999 | Akasaki ................ 257/737 |
| 7,019,400 | B2 | | 3/2006 | Iguchi et al. |
| 2004/0188845 | A1 | * | 9/2004 | Iguchi et al. ............. 257/758 |
| 2006/0001165 | A1 | | 1/2006 | Tokitoh et al. |

FOREIGN PATENT DOCUMENTS

| CN | 1532927 A | 9/2004 |
| JP | 2005-167198 | 6/2005 |
| JP | 2006-5011 | 1/2006 |

* cited by examiner

*Primary Examiner* — Thomas L Dickey
*Assistant Examiner* — Nikolay Yushin
(74) *Attorney, Agent, or Firm* — McGinn IP Law Group, PLLC

(57) ABSTRACT

A semiconductor device of the present invention includes a seal ring structure. The seal ring structure includes a first metal layer including a though hole, the through hole having a bottom portion filled with an insulating material, and a second metal layer formed on the first metal layer. The second metal layer has a projected portion projecting from a bottom of the second metal layer and the projected portion is inserted into a top portion of the through hole.

15 Claims, 22 Drawing Sheets

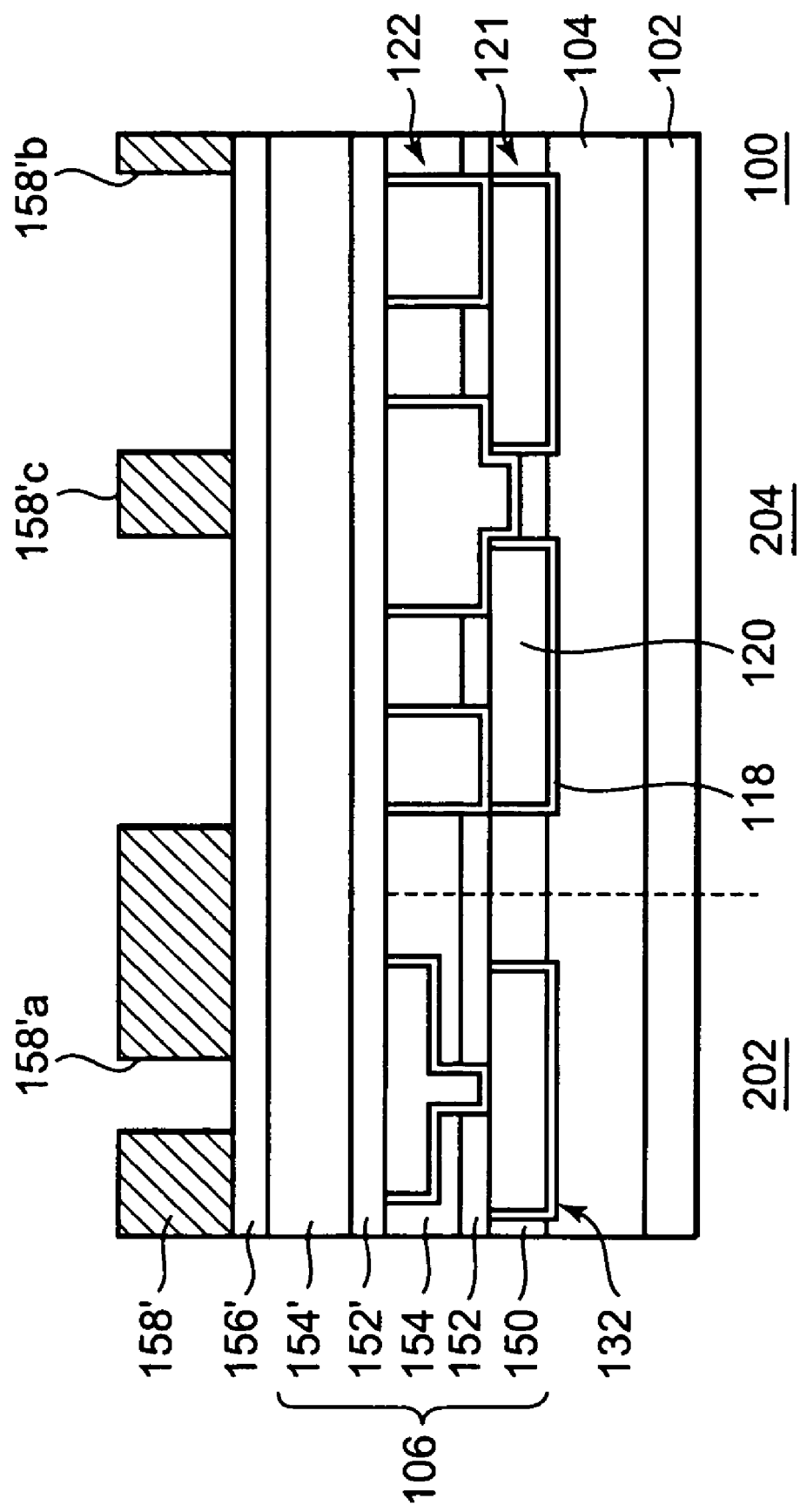

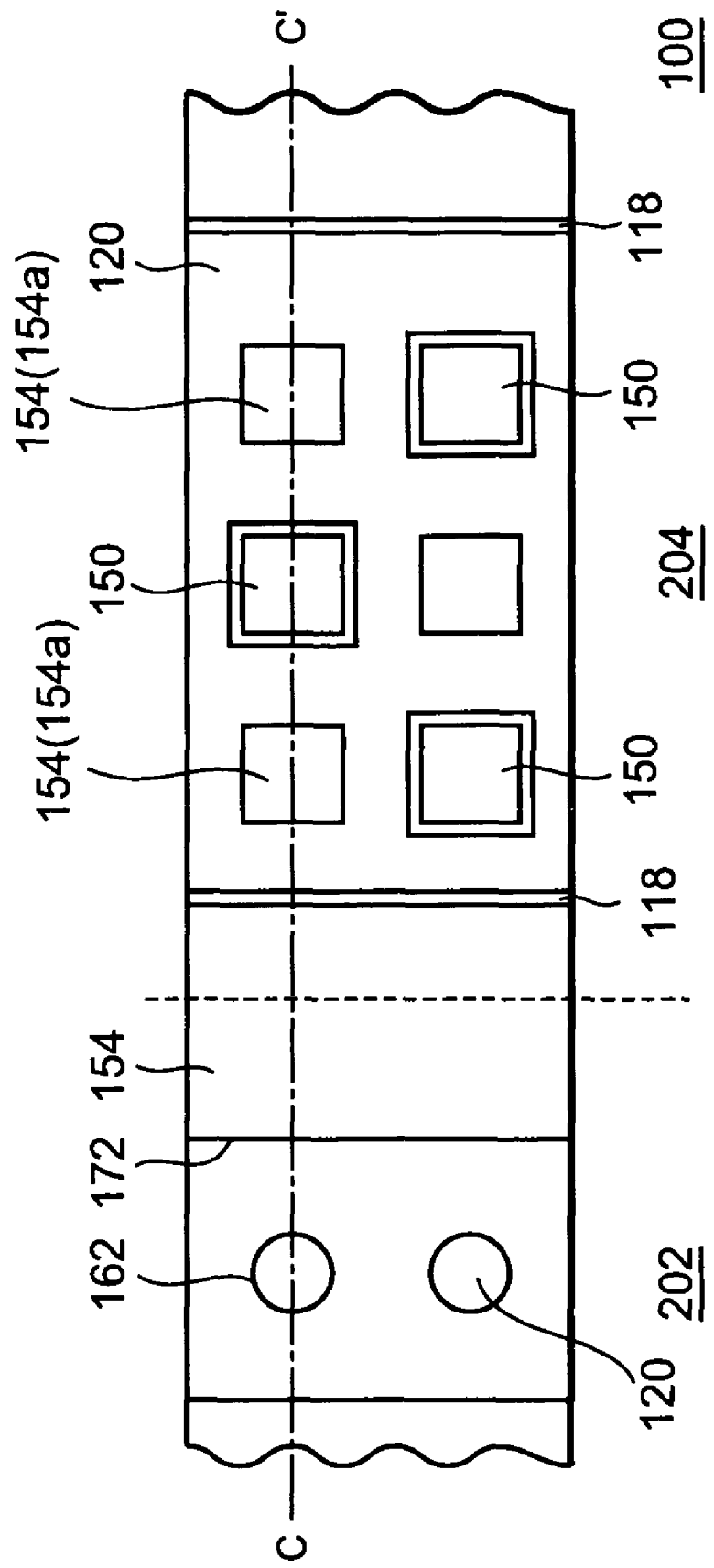

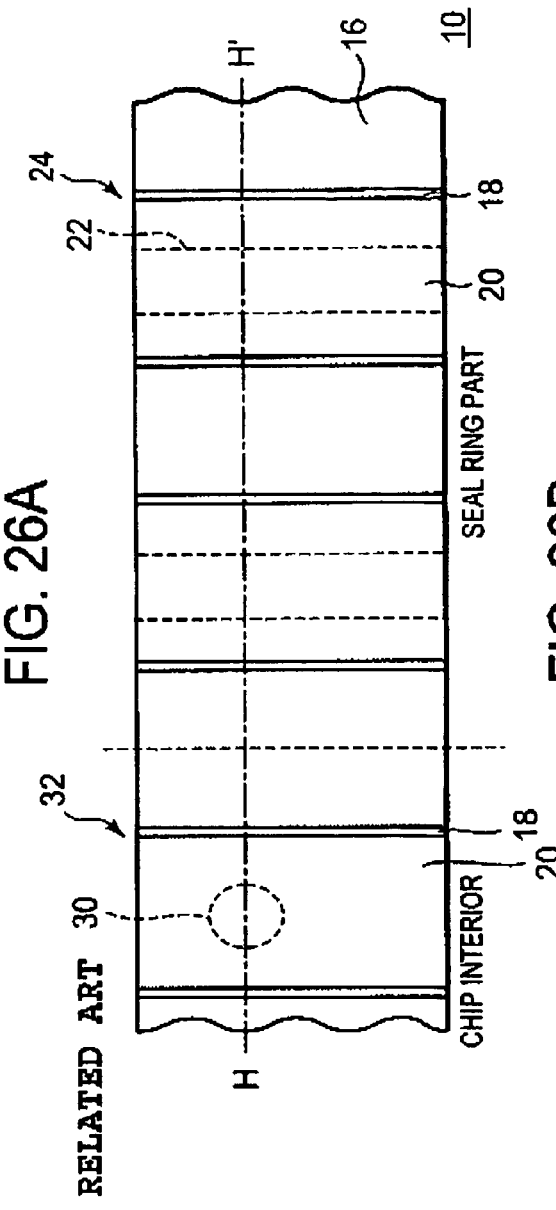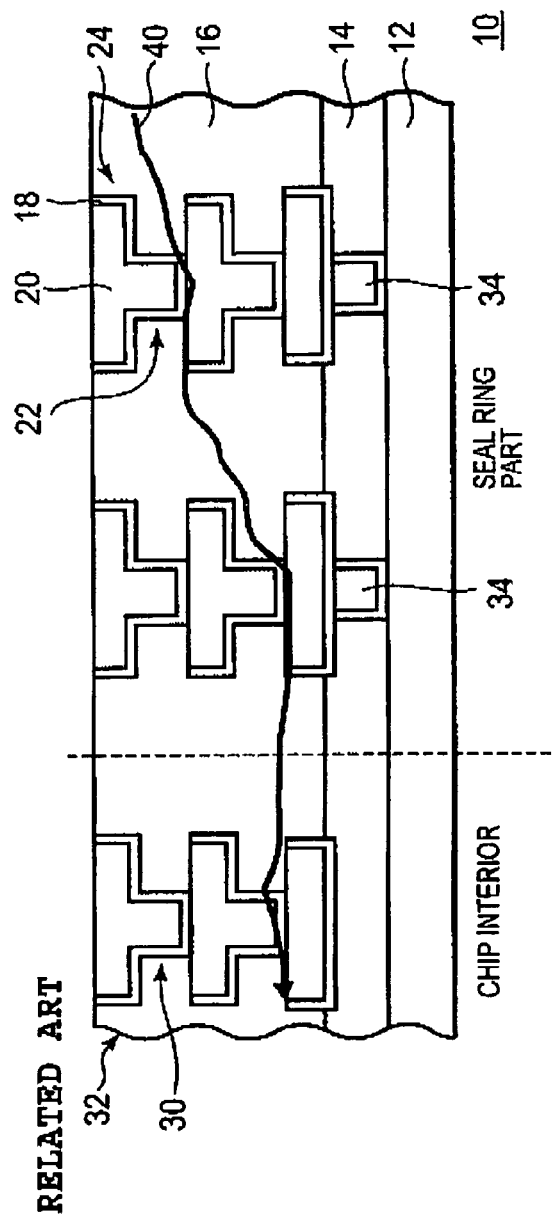

SEMICONDUCTOR DEVICE HAVING SEAL RING STRUCTURE

BACKGROUND OF THE INVENTION

1. Field of the Invention

The present invention relates to a semiconductor device and a method of producing the same.

2. Description of Related Art

In recent years, in accordance with the progress in the performance of semiconductor devices, a technique for forming an insulating film, so-called "low-k film (low dielectric constant insulating film)" having a lower relative dielectric constant than $SiO_2$ has come to be used in a semiconductor device production process. Being available in a great variety of types, a "low-k film" generally has poor adherence and low mechanical strength. Accordingly, there has been a problem that the spread of film detachment and cracks that occur during a wafer dicing process cannot be prevented.

FIGS. 26A and 26B are drawings illustrating a seal ring structure of a related art. A seal ring, which is a bulkhead provided along the periphery of a semiconductor chip in order to prevent moisture from getting into a low dielectric constant film, is generally formed by a wiring layer. FIG. 26A is a lateral plan view of a semiconductor device 10, while FIG. 26B is a vertical front view of the semiconductor device 10. FIG. 26B corresponds to a cross-sectional view taken along the line H-H' of FIG. 26B.

The semiconductor device 10 has a structure in which a substrate 12, such as a silicon substrate, a lower layer insulating film 14, such as a $SiO_2$ film, and an interlayer insulating film 16 containing a low dielectric constant film are stacked together in this order. In the drawing, the left side of the broken line is a chip interior, while the right side of the broken line is a seal ring part. There is a dicing line (not shown in the drawing) on a further outer circumference of the seal ring part. In the chip interior which is an element-forming region, a wiring layer 32 and a via layer 30 are alternately formed in this order in the interlayer insulating film 16. In the seal ring part, a W seal ring 34 is formed in the lower-layer insulating film 14, while a wiring layer 24 and a via layer 22 are alternately formed in this order in the interlayer insulating film 16. The wiring layer 24 and the via layer 22 are formed in the same layer as the wiring layer 32 and the via layer 30 in the chip interior, respectively. Furthermore, each wiring and each via are formed of a barrier metal film 18 and a copper-containing metal film 20.

However, in such a configuration, if a crack or film detachment 40 occurs from the dicing line side located in the right side of the drawing, there has been a problem in which such a crack or film detachment 40 propagates to the inside through a part between the via and the wiring, and then develops into a crack or film detachment in the chip interior.

Patent document 1 (Japanese Patent Application Publication No. 2006-5011) discloses a configuration in which multiple isolated pockets of insulating material are formed in a wide seal ring wiring. The document discloses a configuration having such an arrangement in which the occurrence of dishing and erosion in the wide seal ring wiring during CMP in the formation of wirings is prevented, and therefore the possibility of the occurrence of short circuit among wirings is eliminated.

Patent document 2 (Japanese Patent Application Publication No. 2005-167198) discloses a seal ring configuration in which a continuous seal via is arranged in an interlayer insulating film provided with a via and a wiring forming a dual damascene wiring. By employing this configuration having less junctions in the seal ring part, it is possible to more effectively prevent the invasion of impurities and the like through a junction compared to a configuration having more junctions; therefore, such a configuration is considered to be able to provide a strong seal ring structure.

[Patent document 1] Japanese Patent Application Publication No. 2006-5011

[Patent document 2] Japanese Patent Application Publication No. 2005-167198

However, in the art disclosed in Patent document 1, a via layer and a wiring layer in the seal ring part are alternately formed at the same height as a via layer and a wiring layer in an element forming layer; therefore, junctions in the seal ring are located at the same height as interfaces of the surrounding insulating films. Hence, no solution is provided to the problem in which detachment and cracks from the outer circumference are to spread into the interior.

In the meantime, in the art disclosed in Patent document 2, the number of junctions is reduced. However, junctions in the seal ring are arranged to be at the same height as junctions between wirings and vias in the chip region, and also to be at the same height of interfaces of the surrounding insulating films. Accordingly, in the case where film detachment occurs, there is still a problem of detachment and cracks spreading from the outer circumference to the junction of the seal ring and then also into the interior.

SUMMARY OF THE INVENTION

According to an exemplary aspect of the present invention, a semiconductor device includes a substrate, an element-forming region being formed on the substrate and having a via and a wiring formed therein; and a seal ring being formed on the substrate, and on the outer circumference of the element-forming region so as to surround the element-forming region in a plan view. In the semiconductor device, the seal ring includes a first metal layer having a through hole formed therein so as to surround the element-forming region in a plan view; and a second metal layer formed on the first metal layer so as to be in contact with the first metal layer. In the semiconductor, a lower part of the through hole in the first metal layer is provided with an insulating material formed thereon, and an upper part of the through hole is provided with a metal material, which constitutes the second metal layer, formed to bulge into the upper part. The upper part is not provided with the insulating material formed thereon.

According to the exemplary aspect of the present invention, a method of forming a semiconductor device has an element-forming region and a seal ring part which is formed on the outer circumference of the element-forming region so as to surround the element-forming region is provided. The method includes, forming, on a first insulating film formed on a substrate, a first groove in the element-forming region so as to allow any one of a via and a wiring to be formed, and forming as well a first seal ring groove in the seal ring part so as to surround the element-forming region in a plan view, forming any one of a via and a wiring in the first groove as well as a first metal layer in the first seal ring by filling the first groove and the first seal ring groove with a metal material and then removing the metal material in a part thereof exposed to the outside of the first groove and the first seal ring groove, forming a second insulating film on the first insulating film, forming, on the second insulating film, a second groove in the element-forming region so as to allow any one of a via and a wiring to be formed, and forming as well a second seal ring groove in the seal ring part on the first seal ring groove, and forming any one of a via and a wiring in the second groove as well as a second metal layer, which is in contact with the first metal layer, in the second seal ring groove, by filling the second groove and the second seal ring groove with a metal material, and then removing the metal material in a part thereof exposed to the outside of the second groove and the second seal ring groove. In forming the first seal ring groove, the first seal ring groove is formed by leaving the first insulating film therein. In forming the first metal layer in the first seal ring groove, a through hole is formed in the first metal layer by the first insulating film formed to be left in the first seal ring groove. In forming the second seal ring groove, after the first insulating film is exposed on the bottom surface of the second seal ring groove, an upper part of the exposed first insulating film is removed and leaving the first insulating film in a lower part of the through hole in the first metal layer. In forming the second metal layer, the second metal layer is caused to bulge into the upper part of the through hole in the first metal layer.

The element-forming region may be configured to have a substantially quadrangle shape, and the seal ring may be configured to surround the four sides of the element-forming region. In addition, a dicing line is formed on the outer circumference of the seal ring.

According to the exemplary configuration of the present invention, while the second metal layer is formed so as to be in contact with the first metal layer, the metal material constituting the second metal layer bulge into the through hole in the first metal layer. To be more specific, the seal ring is entirely made of the metal material except for the insulating material formed on a lower part of the through hole. Accordingly, a larger contact area between the metal layers is obtained, and the adherence between the metal layers can be enhanced. Therefore, it is possible to prevent film detachment and cracks that occur during a dicing process from spreading into the element-forming region located in the chip interior. It is also possible to improve moisture resistance. Hence, the yield of the semiconductor device can be improved.

Furthermore, while the metal material constituting the second metal layer bulge into the through hole in the first metal layer, the insulating material is formed on a lower part of the through hole. To be more specific, it is configured that a downwardly-projecting convex part formed on the bottom surface of the second metal layer is buried into the through hole formed in the first metal layer. Accordingly, the bottom surface of the second metal layer in the through hole is located at a height different from that of the bottom surface of the second metal layer in the other region and that of the bottom surface of the through hole in the first metal layer. As a result, there is a variation in the level of the interface between metal layers. According to such a configuration, even if horizontal stress caused by impact during a dicing process spreads to the seal ring, resulting in generating a crack, for example, between the first metal layer and the second metal layer, the crack having spread into a certain through hole in the first metal layer is stopped, in the inside of the through hole, at a wall surface of the first metal layer, so that the further progress of the crack can be prevented. Hence, it is possible to improve the yield of the semiconductor device.

Furthermore, the seal ring according to the present invention can be produced, without adding any new step, simply by preparing a wiring and a via forming a multi-layer wiring structure in a single damascene process or a dual damascene process while forming, in the seal ring part, a pattern different from a pattern of the element-forming region. In addition, when the groove for forming the seal ring is formed in the seal ring part, an insulating film is left in the groove; thus, it is possible to prevent dishing in the process of removing the metal material by using CMP.

According to the present invention, it is possible to improve the yield of a semiconductor device by preventing film detachment and cracks that occur during a dicing process from spreading into the chip interior.

BRIEF DESCRIPTION OF THE DRAWINGS

The above and other exemplary aspects, advantages and features of the present invention will be more apparent from the following description of certain exemplary embodiments taken in conjunction with the accompanying drawings, in which:

FIG. 7 is a process cross-sectional view illustrating the embodiment of a production procedure of the semiconductor device illustrated in FIG. 1;

FIG. 10 is a plan view illustrating a configuration of the semiconductor device illustrated in FIG. 1 in production;

FIGS. 26A and 26B are cross-sectional views for describing problems involved in a semiconductor device of a related art.

DETAILED DESCRIPTION OF THE EXEMPLARY EMBODIMENTS

Figure 1:
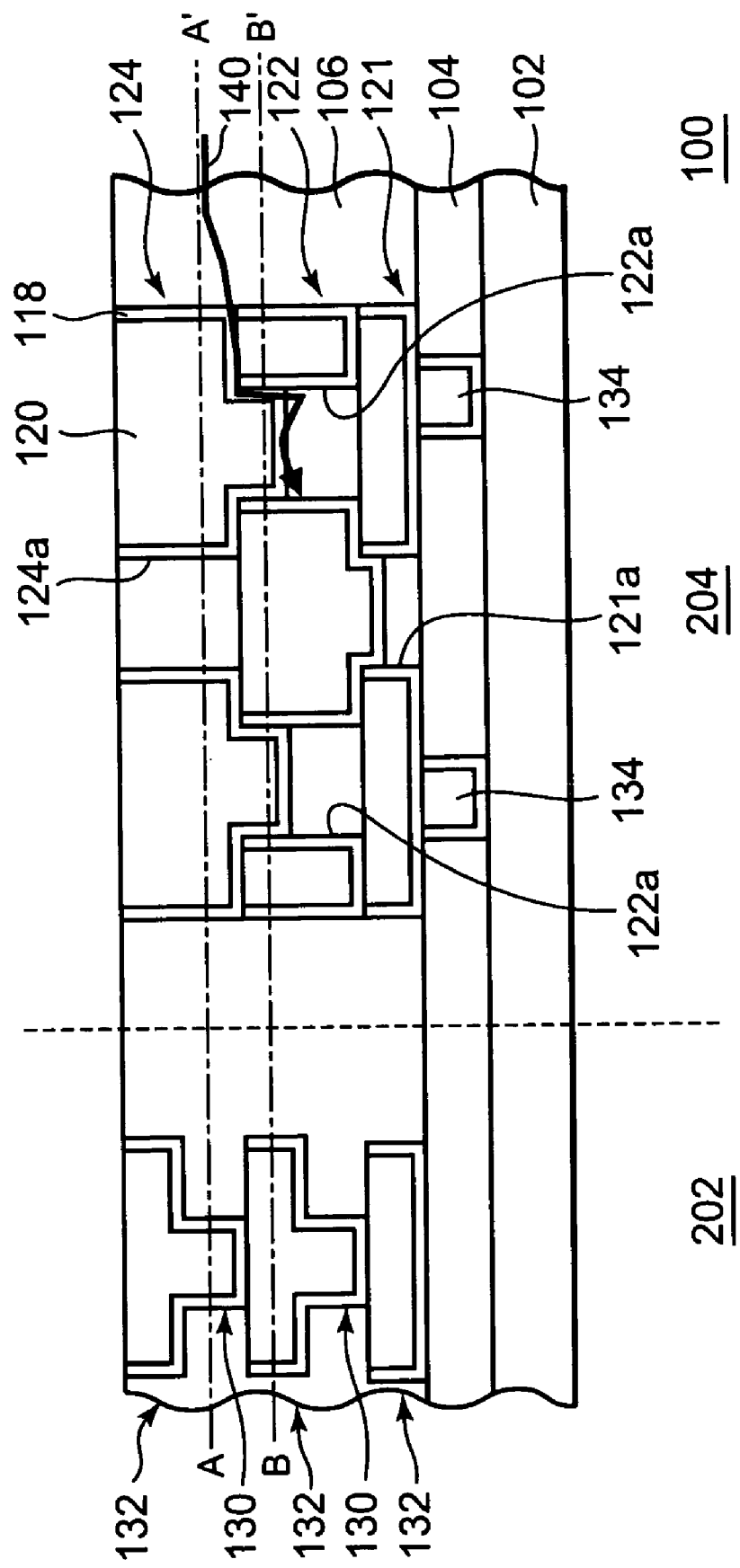
FIG. 1 is a cross-sectional view illustrating a configuration of a semiconductor device according to an exemplary embodiment of the present invention.
Figure 2A:
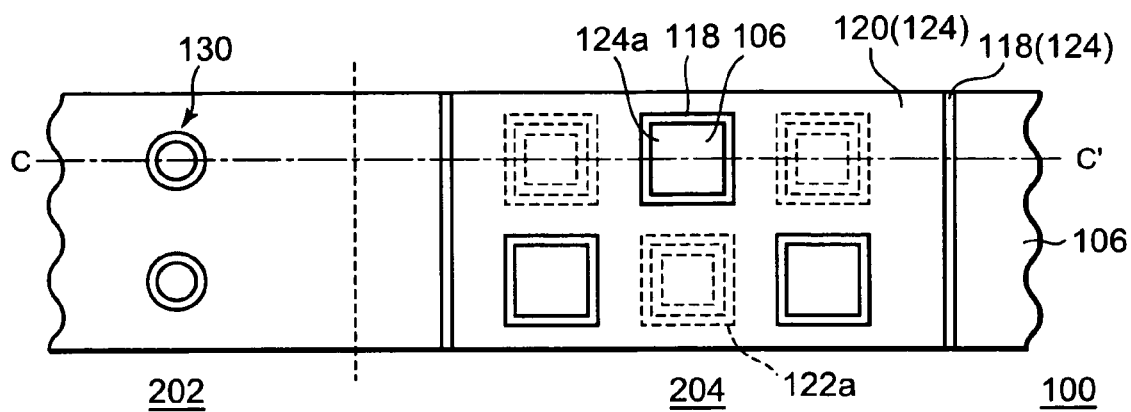
FIGS. 2A and 2B are lateral plan views of the semiconductor device illustrated in FIG. 1.
Figure 2B:
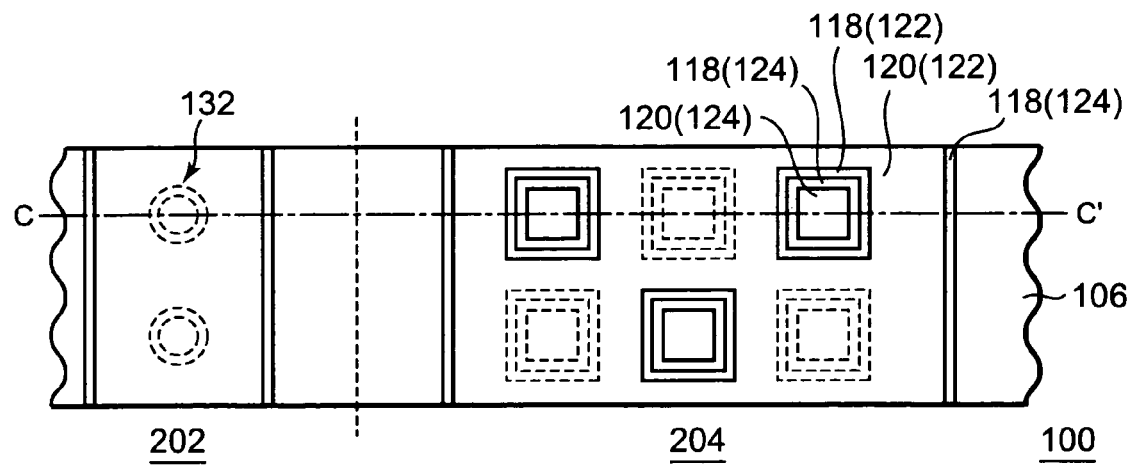

FIG. 1 is a cross-sectional view illustrating a configuration of a semiconductor device according to an exemplary embodiment of the present invention. FIG. 2 is a lateral plan view of the semiconductor device 100 illustrated in FIG. 1. FIG. 2A corresponds to a cross-sectional view taken along the line A-A' of FIG. 1, while FIG. 2B corresponds to a cross-sectional view taken along the line B-B' of FIG. 1. FIG. 1 corresponds to a cross-sectional view taken along the line C-C' of each of FIG. 2A and FIG. 2B.

The semiconductor device 100 includes: a substrate 102, which is, for example, a silicon substrate provided with a element (not shown in the drawing), such as a transistor, formed thereon; a lower layer insulating film 104 formed on the substrate 102; and an interlayer insulating film 106 being formed on the lower-layer insulating film 104 and including a low dielectric constant film. The lower-layer insulating film 104 can be composed of a $SiO_2$ film, for example. In the drawings, the left side of the broken line is a chip interior 202, while the right side of the broken line is a seal ring part 204. On a further outer circumference (the right side of the drawing) of the seal ring part 204, a dicing line is located.

Figure 3:
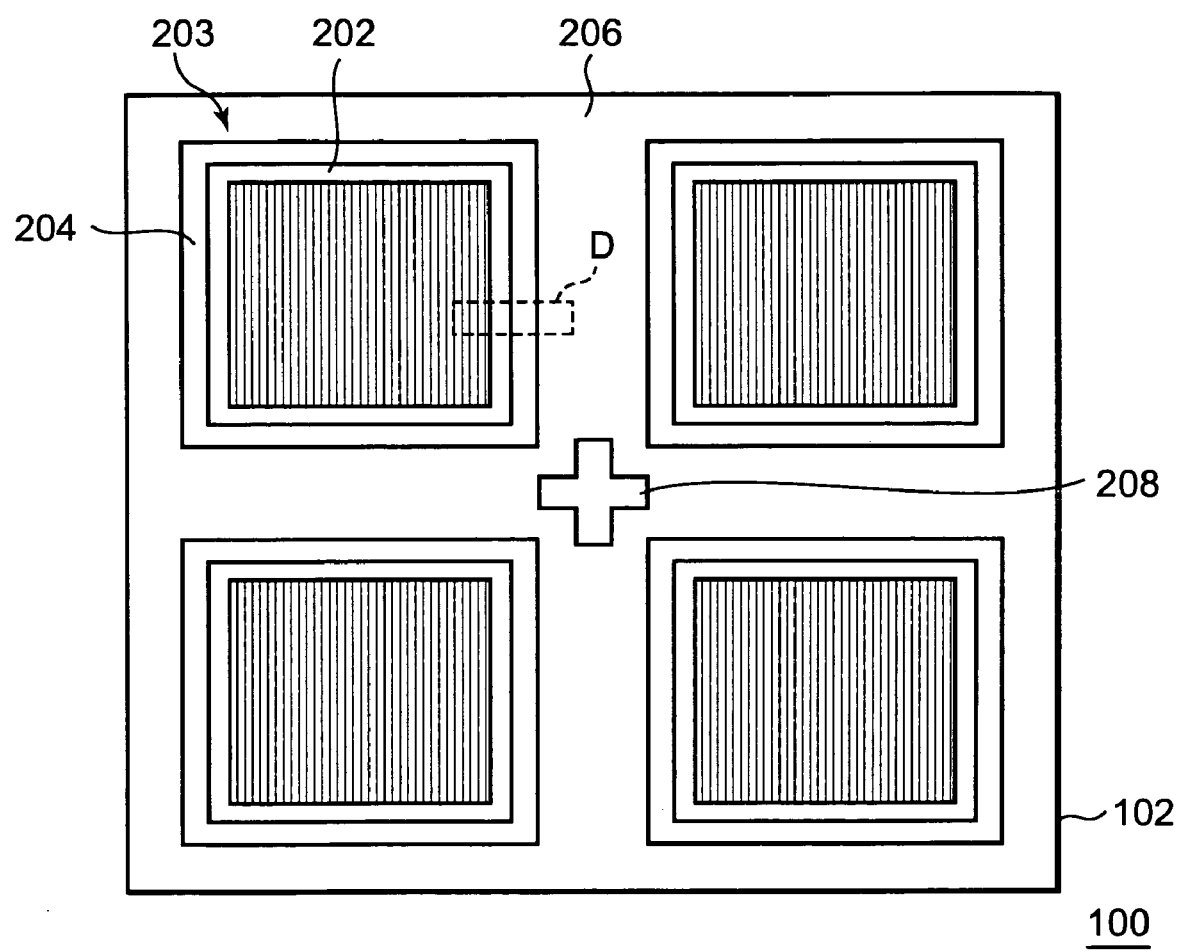
FIG. 3 is a plan view illustrating a configuration in which multiple chips are arranged on a substrate.

FIG. 3 is a plan view illustrating a configuration in which multiple chips 203 are formed on the substrate 102. As shown in FIG. 3, each of the chips 203 has a substantially quadrangle shape. The seal ring part 204 is formed on the outer circumference of the chip interior 202 so as to surround the chip interior 202 in a plan view. Furthermore, the dicing line 206 is formed on the outer circumference of the seal ring part 204 so as to surround the seal ring part 204 in a plan view. In addition, among the individual chips 203, an alignment mark 208 is arranged. FIG. 1 and FIG. 2 are drawings illustrating a part surrounded by a broken line D of FIG. 3.

Referring back to FIG. 1, in the chip interior 202, a wiring layer 132 and a via layer 130 are formed alternately in this order in the interlayer insulation film 106. In this case, a wiring having a dual damascene structure is shown.

In the seal ring part 204, a W (tungsten) seal ring 134 is formed in the lower-layer insulating film 104. Furthermore, in the seal ring part 204, a lower layer metal layer 121, a first metal layer 122, and a second metal layer 124 are formed in this order in the interlayer insulating film 106.

In this case, the via layer 130, the wiring layer 132, the lower layer metal layer 121, the first metal layer 122, and the second metal layer 124 each may be made of a barrier metal film 118 and a copper-containing metal film 120. The barrier metal film 118 may be configured to contain a high-melting point metal (refractory metal). The barrier metal film 118 may be made of, for example, Ta, TaN, Ti, TiN, W, and WN. The copper-containing metal film 120 may be mainly made of copper. The copper-containing metal film 120 may also be configured to further include any one or at least two heterogeneous elements selected from the group consisting of Ag, Al, Au, Pt, Cr, Mo, W, Mg, Be, Zn, Pd, Cd, Hg, Si, Zr, Ti, and Sn. The copper-containing metal film 120 may be formed by, for example, a plating method. In addition, it may be configured that the surface of the copper-containing metal film 120 is provided with, for example, a silicide film formed thereon.

In the present embodiment, the lower layer metal layer 121 is formed so as to have the same film thickness as the wiring layer 132 located at the bottom in the interlayer insulating film 106 in the chip interior 202. The lower layer metal layer 121 includes multiple through holes 121a (FIG. 1 shows only one of them) formed in an island shape in a plan view. Being formed on the lower layer metal layer 121 so as to be in contact with the lower layer metal layer 121, the first metal layer 122 includes multiple through holes 122a formed in an island shape such that the multiple through holes 122a do not overlap with the multiple through holes 121a in the lower layer metal layer 121 in a plan view. In this case, in the individual multiple through holes 121a in the lower layer metal layer 121, a lower part thereof is provided with an insulating material constituting the interlayer insulating film 106, while an upper part that is not provided with the insulating material formed thereon, is provided with a metal material, which constitutes the first metal layer 122, formed to bulge into the upper part. To be more specific, the through hole 121a in the lower layer metal layer 121 is filled in the lower part thereof with the insulating material, and in the upper part thereof with the metal material. In the present embodiment, the first metal layer 122 has, in a part that is not provided with the a through hole 121a in the lower layer metal layer 121 formed thereon, the same film thickness as the sum of the thicknesses of the via layer 130 and the wiring layer 132 in the chip interior 202.

Being formed on the first metal layer 122 so as to be in contact with the first metal layer 122, the second metal layer 124 includes multiple through holes 124a (FIG. 1 shows only one of them) formed in an island shape such that the multiple through holes 124a do not overlap with the multiple through holes 122a in the first metal layer in a plan view. In this case, in the through hole 122a in the first metal layer 122, a lower part thereof is provided with an insulating material, which constitutes the interlayer film 106, formed thereon, while an upper part that is not provided with the insulating material formed thereon is provided with a metal material, which constitutes the second metal layer 124, formed to bulge into the upper part. To be more specific, the through hole 122a in the first metal layer 122 is filled in the lower part thereof with the insulting material, and in the upper part with the metal material. In the present embodiment, the second metal layer 124 has, in a part that is not provided with the a through hole 122a in the first metal layer 122 formed thereon, the same thickness as the sum of the thicknesses of the via layer 130 and the wiring layer 132 in the chip interior 202.

Although not shown in the drawing, the semiconductor device 100 may be structured to further include: in the chip interior 202 a via layer 130 and a wiring layer 132 sequentially and alternately stacked together in this order on the wiring layer 132; and in the seal ring part 204 a metal layer (third metal layer), which has the same configuration as the first metal layer 122 and the second metal layer 124, formed sequentially and alternately on the second metal layer 124. By having such a stacking structure of metal layers, a seal ring is formed in the seal ring part 204. In the embodiment illustrated in FIG. 1, the multiple through holes 121a in the lower layer metal layer 121 and the multiple through holes 121a in the second metal layer 124 are arranged so as to be respectively in a substantially equal position in a plan view.

As shown in FIG. 2, the through holes 122a in the first metal layer 122 and the through holes 124a in the second metal layer 124 can be arranged in a grid pattern in a plan view. In the present embodiment, the through holes 122a and the through holes 124a may be respectively arranged in a staggered pattern.

Moreover, in the seal ring part 204, on a cross section taken along a straight line (C-C' straight line in FIG. 2) extending from the inner circumference to the outer circumference, a row in which the through holes 122a in the first metal layer 122 are formed and a row in which the through holes 124a in the second metal layer 124 are formed are alternately arranged in the direction from the inner circumference to the outer circumference. Furthermore, in the case illustrated in FIG. 2, on the cross section of the seal ring part 204 taken in a long-axis direction (direction perpendicular to the C-C' straight line), a row in which the through holes 122a (displayed by a broken line in FIG. 2) are formed and a row in which the through holes 124a are formed are also arranged alternately.

Furthermore, the seal ring part 204, on a cross section (FIG. 1) taken along a straight line (C-C' straight line in FIG. 2) extending from the inner circumference to the outer circumference, is configured to include the interlayer insulating film 106 arranged to be dispersed. To be more specific, in the present embodiment, the seal ring part 204 has a configuration in which: an almost entire part of the strip-shaped seal ring part 204 illustrated in FIG. 3 is made of a metal material; and the metal material includes an insulating material arranged to be dispersed in an island shape both in a horizontal direction and in a stacking direction.

According to the configuration of the semiconductor device 100 of the present embodiment, the seal ring is entirely made of a metal material except for the insulating material formed on the lower part of the through hole. Accordingly, contact areas between the metal layers are larger. Therefore, it is possible to enhance the adherence between the metal layers, and thereby to prevent film detachment and cracks that occur during a dicing process from spreading into the element-forming region located in the chip interior. In addition, it is possible to improve moisture resistance. Hence, it is possible to improve the yield of the semiconductor device.

Furthermore, it is configured that a downwardly-projecting convex part formed on the bottom surface of the second metal layer 124 is buried into the through hole 122a formed in the first metal layer 122. Accordingly, the bottom surface of the second metal layer 124 has different levels. As a result, the bottom surface of the second metal layer 124 in a part where bulging into the through hole 122a is located at a height different from that of the bottom surface of the through hole 122a in the first metal layer 122. According to such a configuration, as shown in FIG. 1, even if horizontal stress caused by impact during a dicing process spreads to the seal ring, resulting in generation of a crack or film detachment 140, for example, between the first metal layer 122 and the second metal layer 124, the crack or film detachment 140 having spread into a certain through hole 122a in the first metal layer 122 is stopped, in the inside of the through hole, at a wall surface of the second metal layer 124, so that the further progress of the crack or film detachment 140 can be prevented. Hence, it is possible to improve the yield of the semiconductor device.

Figure 25A:
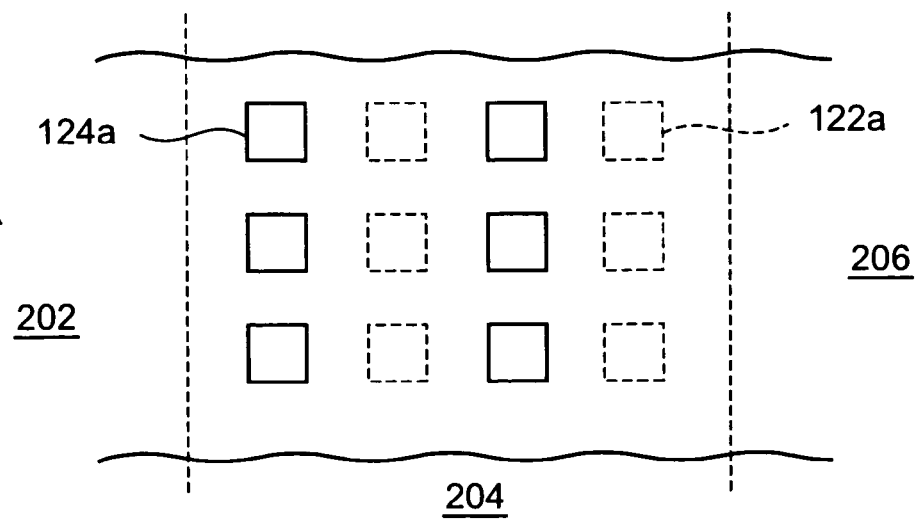
FIGS. 25A to 25C are plan views illustrating another example of an arrangement of through holes formed on a first metal layer and a second metal layer.

It should be noted that the through holes 122a and the through holes 124a may be arranged in various ways. FIG. 25 is a plan view schematically illustrating arrangements of the through holes 122a and the through holes 124a. As shown in FIG. 1, the through hole 124a and the through hole 122a are each provided in different metal layers. However, for better understanding, this drawing is presented so as to show the through holes 122a and the through holes 124a on the same plane surface, and the through holes 122a are indicated by broken lines. For example, as shown in FIG. 25A, in a long-axis direction (a longitudinal direction in the drawing) of the seal ring part 204, either the through holes 124a only or the through holes 122a only may be arranged in each row.

Figure 25B:
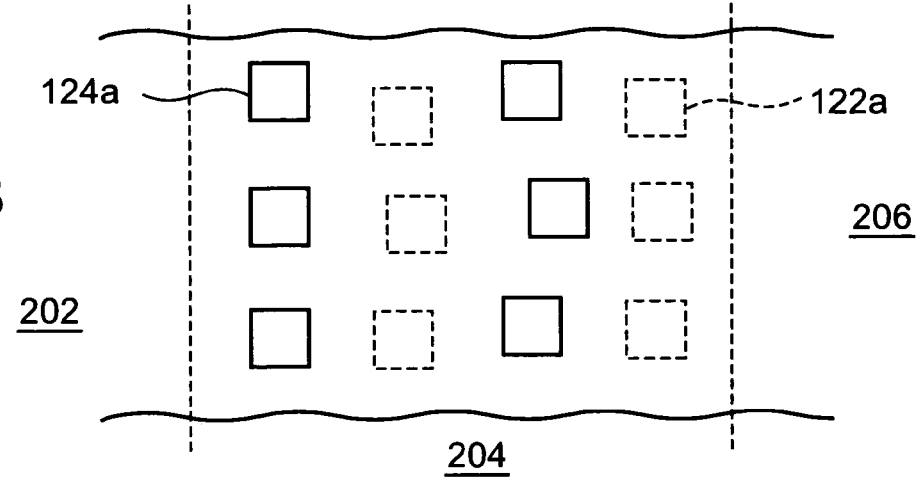
Figure 25C:
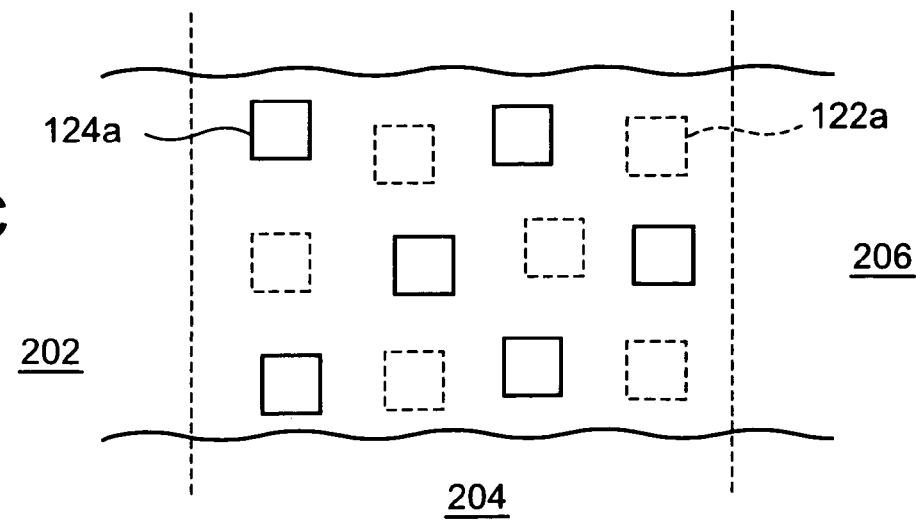

Furthermore, as shown in FIG. 25B and FIG. 25C, through holes arranged in a single row or in a single line in a plan view are not necessarily to be strictly arranged in a straight line; therefore, the through holes 122a and the through holes 124a are only needed to be arranged in a substantially grid pattern.

Furthermore, the through holes 122a and the through holes 124a are not necessarily arranged in a grid pattern, and only needed to be arranged to be dispersed accordingly in the seal ring part 204 provided so as to surround the chip interior 202. To be more specific, the through holes 122a and the through holes 124a can be formed in any arrangement as long as there is a repeated structure of a configuration in which multiple convex portions arranged to be dispersed on the bottom surface of the second metal layer 124 are each buried into the through holes 122a, and then multiple convex portions arranged to be dispersed on the bottom surface of the metal layer formed on the second metal layer 124 are each buried into the through holes 124a. By having such a configuration, likewise as the configuration described above, it is possible to prevent cracks and film detachment from spreading into the chip interior 202. In addition, it is preferable that the through holes 122a and the through holes 124a be arranged to be substantially evenly dispersed. By such an arrangement, dishing can be prevented in a production procedure, which will be described in the following section; therefore, it is possible to improve the production efficiency of the semiconductor device. It should be noted that, in the seal ring part 204, it is preferable that the through holes 122a in the first metal layer 122 and the through holes 124a in the second metal layer 124 be each provided nearly evenly on the outer circumference of the chip interior 202 so as to surround the entire circumference of the chip interior 202 in order to prevent cracks and film detachment having spread from the exterior from spreading into the chip interior 202.

Next, a description will be given of an embodiment of a production procedure of the semiconductor device 100 illustrated in FIG. 1 and FIG. 2. FIG. 4 to FIG. 7 are each a cross-sectional process drawing illustrating an exemplary production procedure of the semiconductor device 100. FIG. 8 to FIG. 11 are each a plan view illustrating a configuration of the semiconductor device 100 in production. In these drawings, although a description of the W seal ring 134 is omitted, it may be configured that the W seal ring 134 is formed, as shown in FIG. 1, in the lower-layer insulating film 104 in the semiconductor device 100. In addition, in these drawings, the interlayer insulating film 106 is composed of a multilayer structure including a first interlayer insulating film 150, a second interlayer insulating film 152, and a third interlayer insulating film 154.

Figure 8:
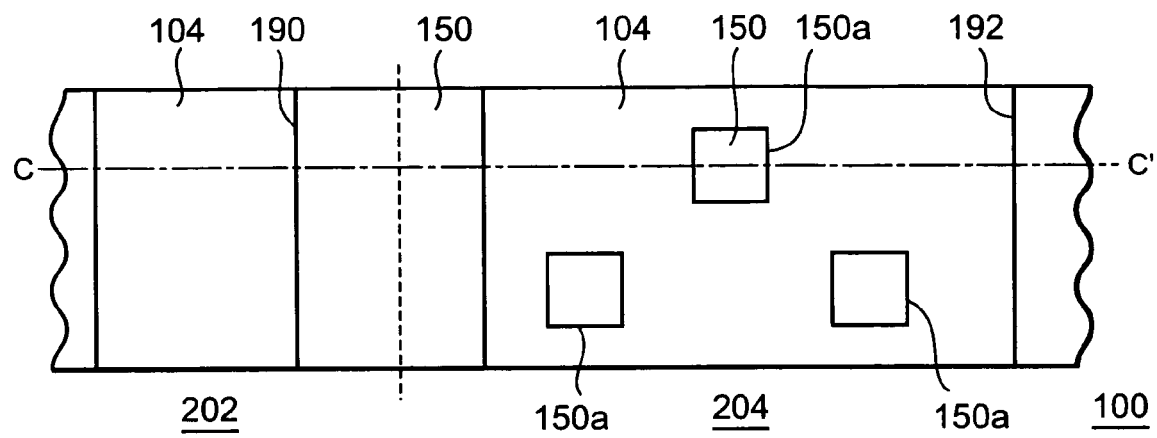
FIG. 8 is a plan view illustrating a configuration of the semiconductor device illustrated in FIG. 1 in production.

First, a description will be given of a production procedure of the structure illustrated in FIG. 4A. The first interlayer insulating film 150 is formed on the lower layer insulating film 104. Then, an antireflection film and a resist film having a pattern corresponding to the wiring layer 132 and the lower layer metal layer 121 are formed in this order on the first interlayer insulating film 150. While having the resist film and the antireflection film each serving as a mask, the first interlayer insulating film 150 is patterned. FIG. 8 is a plan view illustrating a configuration of the first interlayer insulating film 150 at this point. In the drawing, the while area indicates the portion in which the first interlayer insulating film 150 is removed and therefore the lower layer insulating film 104 comes to be exposed. In the drawing, the dotted area indicates the portion in which the first interlayer insulating film 150 is left without having been removed. In the chip interior 202, a wiring groove 190 is formed. In the meantime, in the seal ring part 204, a seal ring groove 192 is formed throughout the part, and, in the seal ring groove 192, multiple island-shape insulating films 150a, which are provided by the first interlayer insulating film 150 not having been removed by etching, are formed in a staggered pattern.

Figure 9:
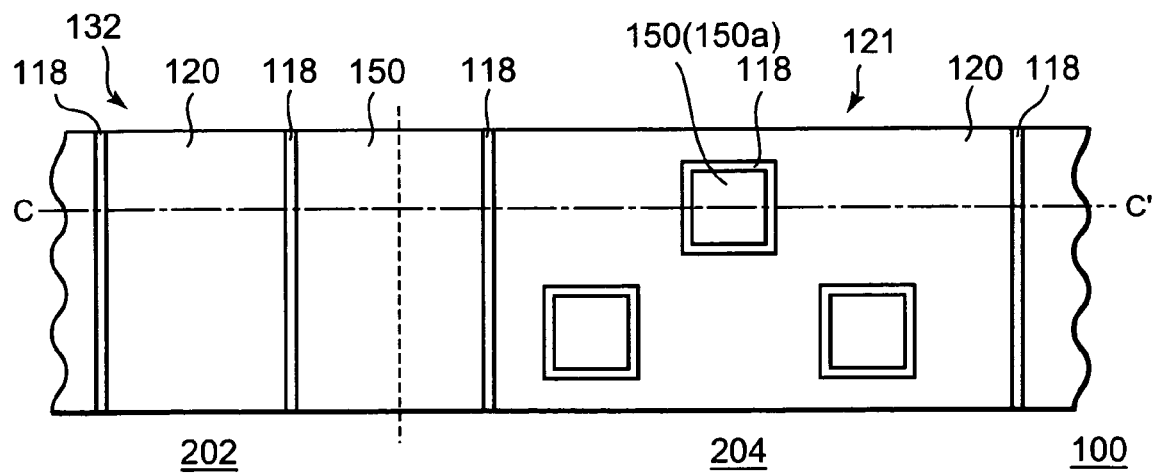
FIG. 9 is a plan view illustrating a configuration of the semiconductor device illustrated in FIG. 1 in production.

Thereafter, a barrier metal film 118 is formed on the entire upper surface of the substrate 102. As a result, the barrier metal film 118 is formed on the inner wall of the wiring groove 190, the inner wall of the seal ring groove 192, and around the island-shape insulating films 150a. Then, a copper-containing metal film 120 is formed on the barrier metal film 118 so that the wiring groove 190 and the seal ring groove 192 are buried into the copper-containing metal film 120. Thereafter, the copper-containing metal film 120 and the barrier metal film 118 are each removed in a part thereof exposed to the outside of the wiring groove 190 and the seal ring groove 192 by using CMP. At this time, in the CMP process, dishing can be prevented because the island-shape insulating films 150a have been formed in the seal ring groove 192. After the above-described procedure, a wiring layer 132 and a lower layer metal layer 121 are formed, and a configuration illustrated in FIG. 9 is obtained. FIG. 4A corresponds to a cross-sectional portion taken along the line C-C' of each of FIG. 8 and FIG. 9.

Referring back to FIG. 4A, a second interlayer insulating film 152 and a third interlayer insulating film 154 are stacked together in this order on the first interlayer insulating film 150, the wiring layer 132, and the lower layer metal layer 121 which are located on the entire upper surface of the substrate 102. In this case, the first interlayer insulating film 150 and the third interlayer insulating film 154 may be composed of a low dielectric constant film, such as SiOC. A low dielectric constant film may be, for example, an insulating film having a relative dielectric constant of 3.3 or lower, preferably of 2.9 or lower. As a low dielectric constant film, in addition to SiOS, the following materials may be used, for example: polyhydrogen siloxanes, such as HSQ (hydrogen silsesquioxane), MSQ (methyl silsesquioxane), and MHSQ (methylated hydrogen silsesquioxane); aromatic organic materials, such as polyallyl ether (PAE), divinylsiloxane-bis-benzocyclobutene (BCB), and SiLK (a registered trademark); SOG; FOX (flowable oxide); Cytop; and BCB (bensocyclobutene). Furthermore, as a low dielectric constant film, porous films respectively made of these materials may be used. The first interlayer insulating film 150 and the third interlayer insulating film 154 may be either made of the same material or different materials.

The second interlayer insulating film 152 serving as an etching prevention film during the formation of a via hole and a wiring groove may be made of a material having a function of preventing copper contained in the copper-containing metal film 120 from diffusing. The second interlayer insulating film 152 may be made of, for example, SiCN, SiN, SiC, SiOF, and SiON.

Furthermore, on the third interlayer insulating film 154, an antireflection film 156 and a resist film 158 having a predetermined pattern are stacked together in this order. Then, the structure illustrated in FIG. 4A is obtained. In this case, in the chip interior 202, the resist film 158 has an opening pattern provided by a pattern 158a corresponding to the via hole 162. In the seal ring part 204, the resist film 158 has a pattern including: an opening provided by a pattern 158b corresponding to a seal ring groove 160, which will be described later; and portions 158c and 158d each left for masking an island-shape insulating film 154a, which will be described later, so that the island-shape insulating film 154a can be formed to be dispersed in the seal ring groove 160.

While having the resist film 158 and the antireflection film 156 thus formed each serving as a mask, the third interlayer insulating film 154 and the second interlayer insulating film 152 are etched so as to form a via hole 162 (first groove) and a seal ring groove 160 (first seal ring groove). Thereafter, the resist film 158 and the antireflection film 156 are removed by ashing and the like. At this point, the island-shape insulating film 154a is formed in the seal ring groove 160 (FIG. 4B). In this process, while the slow progress of etching in the via hole 162 having a narrow width allows the second interlayer insulating film 152 to be left therein, the fast progress of etching in the wide seal ring groove 160 having a wide width allows the second interlayer insulating film 152 to be subjected to etching. In this process, in the case where the copper-containing metal film 120 or the barrier metal film 118 is located under the second interlayer insulating film 152, the metal film serves as an etching prevention film. As a result, the etching stops when reaching the metal film. On the other hand, in the case where the first interlayer insulating film 150 (island-shape insulating film 150a) is located under the second interlayer insulating film 152, after the second interlayer insulating film 152 has been removed by etching, the first interlayer insulating film 150 is also etched. As a result, a concave portion is formed in the through hole in the lower layer metal layer 121.

Figure 5A:
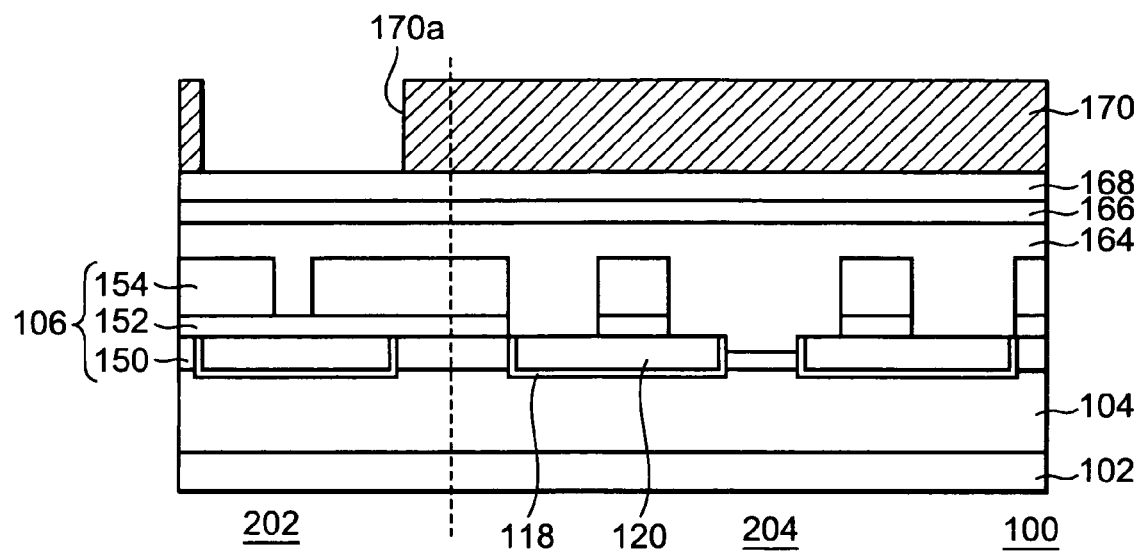
FIGS. 5A and 5B are process cross-sectional views illustrating the embodiment of a production procedure of the semiconductor device illustrated in FIG. 1.

Next, a lower resist film 164 is formed on the entire surface of the third interlayer insulating film 154, the second interlayer insulating film 152, the lower layer metal layer 121, and the first interlayer insulating film 150 so as to eliminate the level differences among these layers. Furthermore, on the lower resist film 164, a low-temperature oxide film 166 (an oxide film formed at a low temperature, for example, 200° C., which does not cause denaturation of a resist), an antireflection film 168, and an upper layer resist film 170 having a predetermined pattern are stacked together in this order (FIG. 5A). In this case, in the chip interior 202, the upper layer resist film 170 has an opening pattern provided by a pattern 170a corresponding to the wiring groove. In the meantime, in the seal ring part 204, the upper layer resist film 170 does not have an opening pattern. Accordingly, in the following etching process, the seal ring part 204 is not etched. Thereafter, while having the upper layer resist film 170, the antireflection film 168, the low-temperature oxide film 166, and the lower layer resist film 164 each serving as a mask, the third interlayer insulting film 154 is etched so as to form a wiring groove 172. As a result, a dual damascene wiring groove (first groove) composed of the via hole 162 and the wiring groove 172 is formed in the chip interior 202. Subsequently, the upper layer resist film 170, the antireflection film 168, the low-temperature oxide film 166, and the lower layer resist film 164 are removed by ashing and the like (FIG. 5A).

Figure 5B:
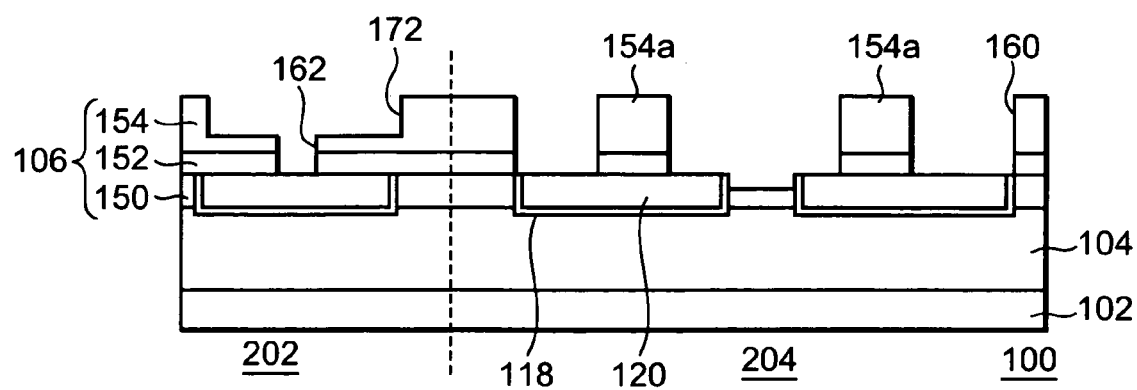

FIG. 10 is a plan view illustrating the configuration of the semiconductor device 100 at this point. FIG. 5B corresponds to a cross-sectional view taken along the line C-C' of FIG. 10. In the drawing of FIG. 10, the white area in the chip interior 202 indicates the portion in which the wiring groove 172 is formed in the third interlayer insulating film 154. In the drawing, the dotted area indicates the portion in which the third interlayer insulating film 154 is left without having been removed. To be more specific, in the chip interior 202, the portions indicated by the dotted area and the white area, although both having the third interlayer insulating film 154 exposed on the surface, have different height levels. In the seal ring part 204, the seal ring groove 160 has therein portions: in which the barrier metal film 118 and the copper-containing metal film 120 are exposed; and in which the first interlayer insulating film 150 is exposed. In addition, in the seal ring groove 160, multiple island-shape insulating films 154a which are formed by the third interlayer insulating film 154 not having been removed by etching are formed in a staggered pattern.

Figure 6A:
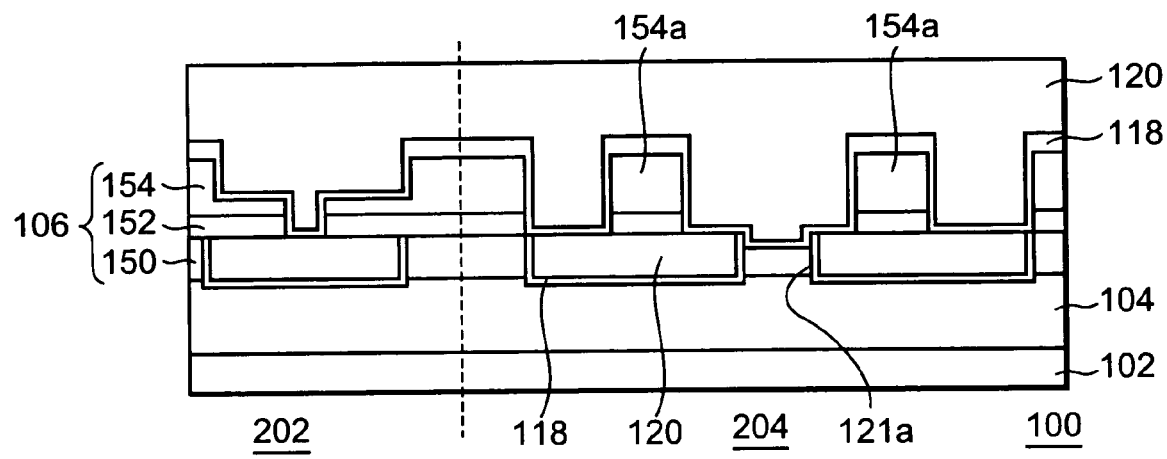
FIGS. 6A and 6B are process cross-sectional views illustrating the embodiment of a production procedure of the semiconductor device illustrated in FIG. 1.
Figure 6B:
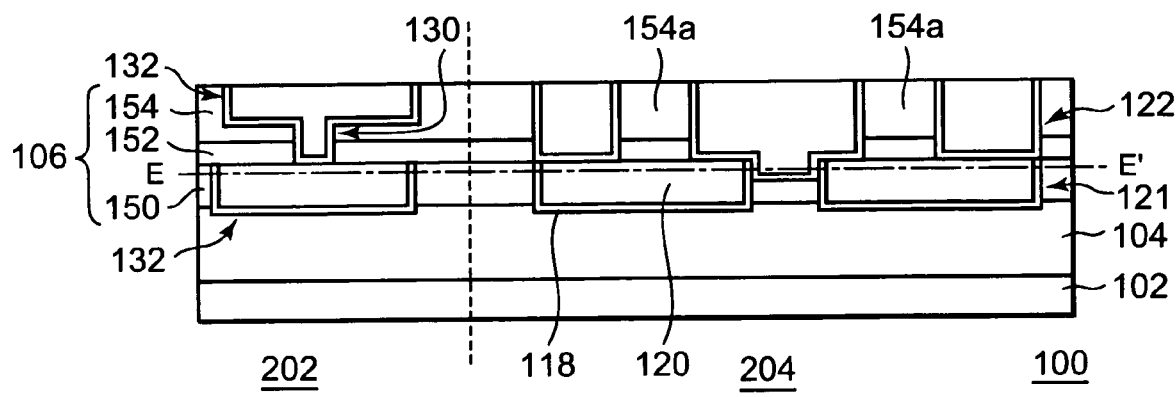

Next, as shown in FIG. 6A, a barrier metal film 118 is formed on the entire upper surface of the substrate 102. As a result, the barrier metal film 118 is formed on: the inner wall of the wiring groove 172 and the via hole 162; the inner wall of the seal ring groove 160; the periphery of the island-shape insulating film 154a; and the inner wall of the upper part, in which the island-shape insulating film 150a has been removed, of the through hole in the lower layer metal layer 121. Then, the copper-containing metal film 120 is formed on the barrier metal film 118 so as to bury the wiring groove 172, the via hole 162, and the seal ring groove 160 into the copper-containing metal film 120. Thereafter, the copper-containing metal film 120 and the barrier metal film 118 are each removed in a part thereof exposed to the outside of the wiring groove 172 and the seal ring groove 160 by using CMP. As a result, the wiring layer 132 and the first metal layer 122 are formed (FIG. 6B). In the CMP process, dishing can be prevented because the island-shape insulating film 154a has been formed in the seal ring groove 160.

Figure 11A:
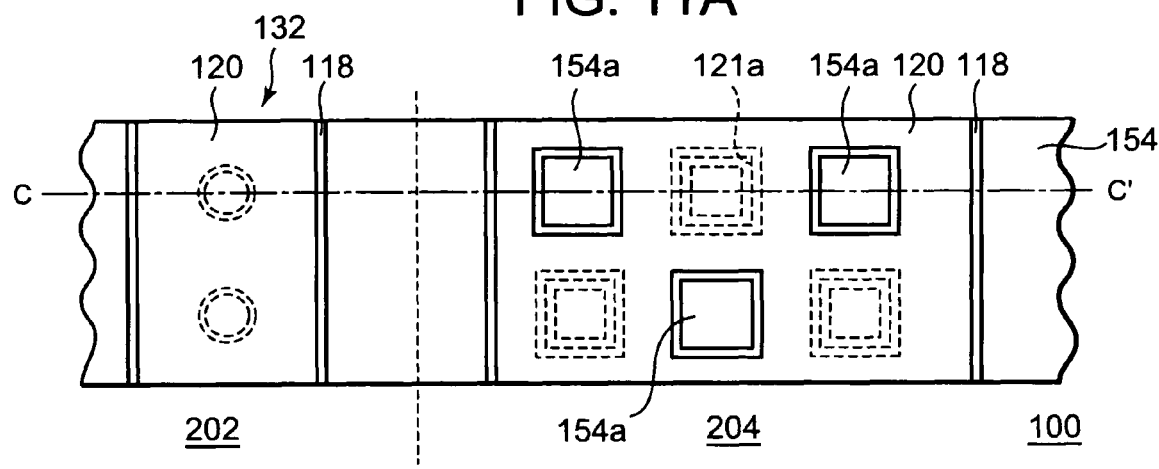
FIGS. 11A and 11B are plan views illustrating a configuration of the semiconductor device illustrated in FIG. 1 in production.
Figure 11B:
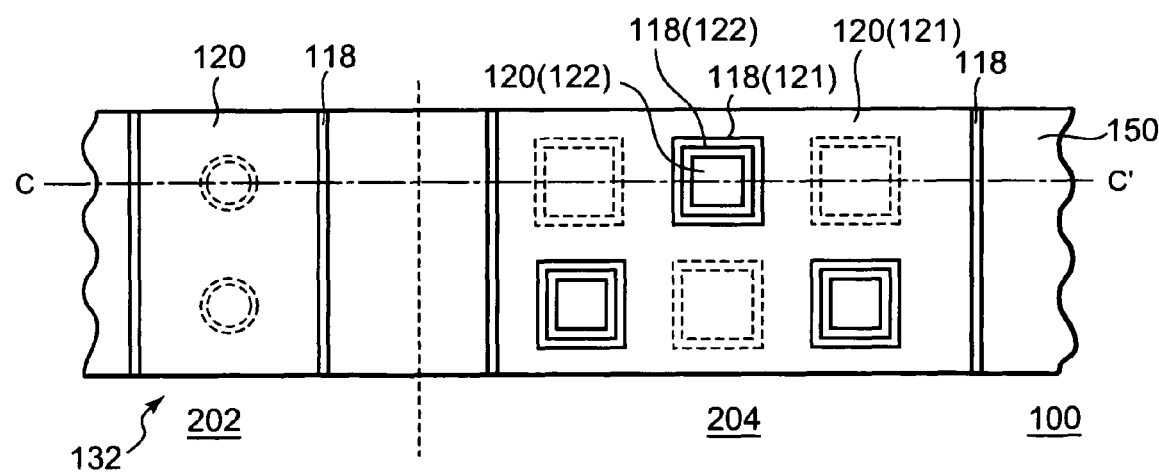

FIG. 11A is a plan view illustrating a state of FIG. 6B, and FIG. 11B is an E-E' cross-sectional view of FIG. 6B. FIG. 6B corresponds to a cross-sectional view taken along the line C-C' of each of FIG. 11A and FIG. 11B.

Thereafter, an interlayer insulating film 152', an interlayer insulating film 154', an antireflection film 156', and a resist film 158' having a predetermined pattern are formed on the entire upper surface of the substrate 102. The interlayer insulating film 152' and the interlayer insulating film 154' each may be made of a material such as the above-described materials for the second interlayer insulating film 152 and the third interlayer insulating film 154. In this case, in the chip interior 202, the resist film 158' has a pattern in which an opening is provided by a pattern 158' corresponding to the via hole. In the seal ring part 204, the resist film 158' has a pattern including: an opening provided by a pattern 158'b corresponding to the seal ring groove; and portions 158' left for masking the interlayer insulating film 154' so that the interlayer insulating film 154' in the seal ring groove can be arranged to be dispersed in an island shape at positions not overlapping with the island-shape insulating film 154a in a plan view (FIG. 7). Thereafter, while having the resist film 158' and the antireflection film 156' each serving as a mask, the interlayer insulating film 154' and the interlayer insulating film 152' are etched to form a via hole (second groove) in the chip interior 202 and a seal ring groove (second seal ring groove) in the seal ring part 204. Then, by going through the same procedure as that for forming the first metal layer 122, the interlayer insulating film 154' in the chip interior 202 is etched to form a wiring groove so as to form a dual damascene wiring groove (second groove). Subsequently, by filling the groove with a metal material, and then removing the metal material in a part thereof exposed to the outside of the groove, a dual damascene wiring and the second metal layer 124 are formed in the chip interior 202 and the seal ring part 204, respectively. By taking the procedure describe above, the semiconductor device 100 having the configuration illustrated in FIG. 1 is produced.

As described above, according to the exemplary production procedure of the semiconductor device 100 of the present embodiment, it is possible to prepare a wiring and a via in a multilayer wiring structure in the chip interior 202 by using dual damascene process, and at the same time, to produce a seal ring by simply forming in the seal ring part 204 a pattern different from that in the chip interior 202 without adding a new process. Furthermore, during the formation of the seal ring groove, since the insulating film has been left in an island shape in the groove, dishing can be prevented in the process of removing a metal material by using CMP.

Furthermore, by repeating the same process, it is possible to produce the semiconductor device 100 having a configuration in which: a via layer 130 and a wiring layer 132 are further formed sequentially and alternately on the wiring layer 132; and a metal layer (third metal layer) having the same configuration as the first metal layer 122 and the second metal layer 124 is further formed sequentially and alternately on the second metal layer 124.

Next, a description will be given of another exemplary embodiment of a production procedure of the semiconductor device 100 illustrated in FIG. 1 and FIG. 2. FIGS. 12 to 15 are each a process cross-sectional view of an exemplary production procedure of the semiconductor device 100. In this case, a description of the W seal ring 134 is omitted as well; however, the lower layer insulating film 104 in the semiconductor device 100 may be configured, as shown in FIG. 1, to include the W seal ring 134 formed therein. The present embodiment is different from the embodiment described by referring to FIGS. 4 to 11 because patterning is performed by using a multilayer hard mask in the present embodiment.

Figure 4A:
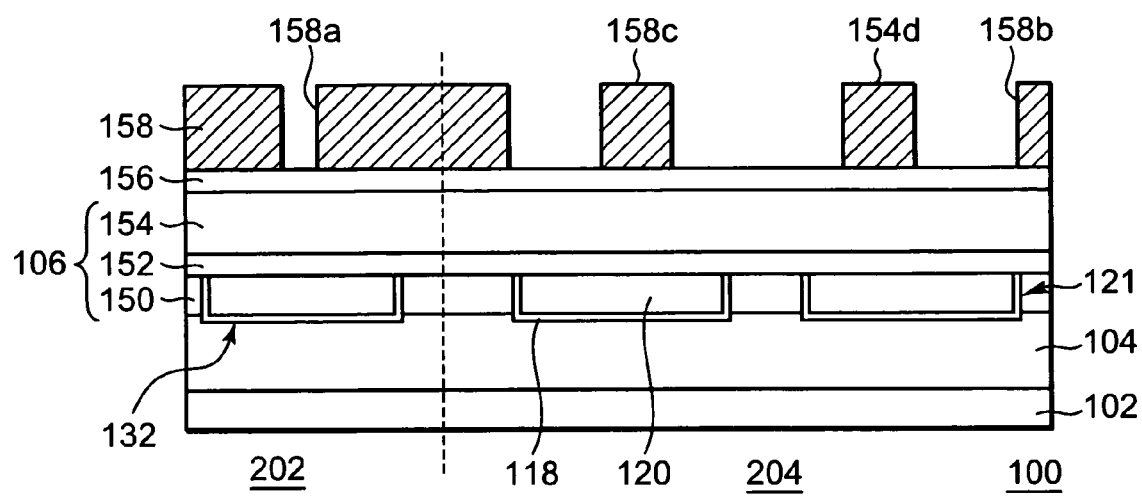
FIGS. 4A and 4B are process cross-sectional views illustrating an exemplary embodiment of a production procedure of the semiconductor device illustrated in FIG. 1.
Figure 4B:
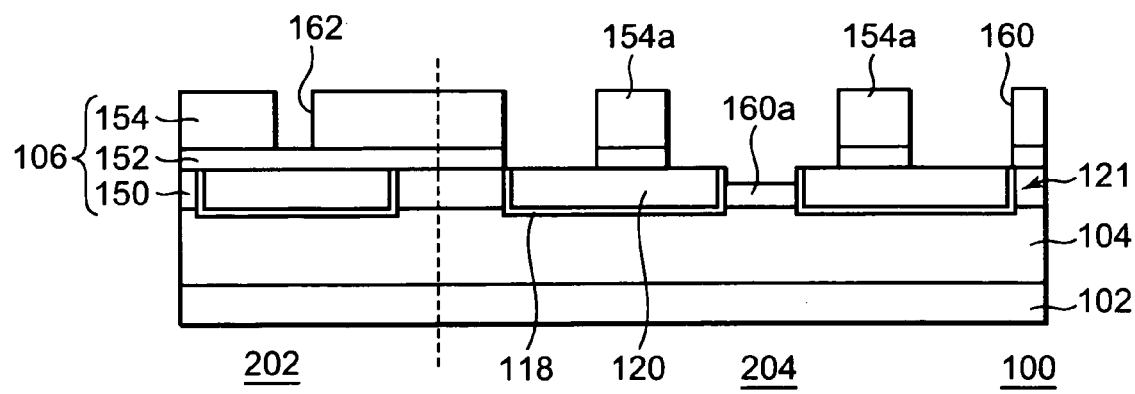
Figure 12A:
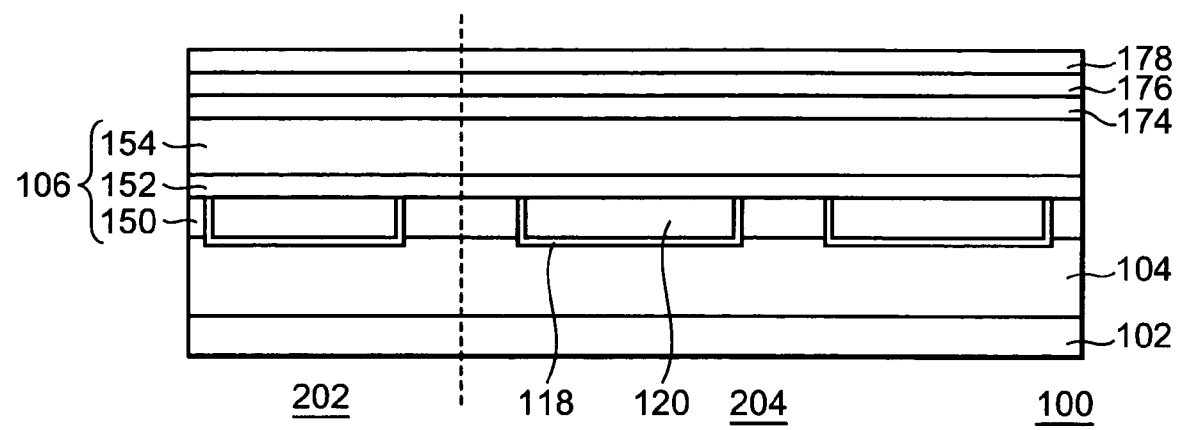
FIGS. 12A and 12B are process cross-sectional views of another exemplary embodiment of a production procedure of the semiconductor device illustrated in FIG. 1.
Figure 12B:
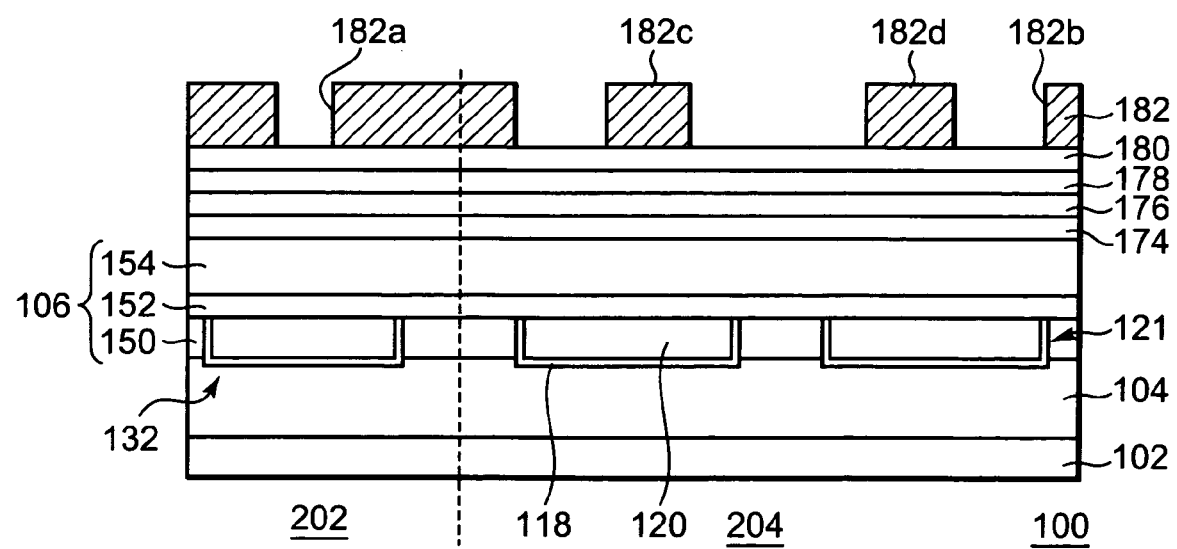

First, as in the description by referring to FIG. 4A, the wiring layer 132 and the lower layer metal layer 121 are formed in the first interlayer insulating film 150. Then, the second interlayer insulating film 152 and the third interlayer insulating film 154 are stacked together in this order on the first interlayer insulating film 150, the wiring layer 132, and the lower metal layer 121. Next, a first hard mask 174, a second hard mask 176, and a third hard mask 178 are formed on the third interlayer insulating film 154 (FIG. 12B). The first hard mask 174, the second hard mask 176, and the third hard mask 178 are made of $SiO_2$, SiN, and SiC, respectively.

Thereafter, an antireflection film 180 and a resist film 182 having a predetermined pattern are stacked together in this order on the third hard mask 178 (FIG. 12B). In this case, in the chip interior 202, the resist film 182 has an opening pattern provided by a pattern 182a corresponding to the via hole. In the seal ring part 204, the resist film 182 has a pattern including: an opening provided by a pattern 182b corresponding to the seal ring groove; and portions 182c and 182d left for masking an island-shape insulating film 154a, which will be described later, so that the island insulating film 154a in the seal ring groove can be arranged to be dispersed in an island shape.

Figure 13A:
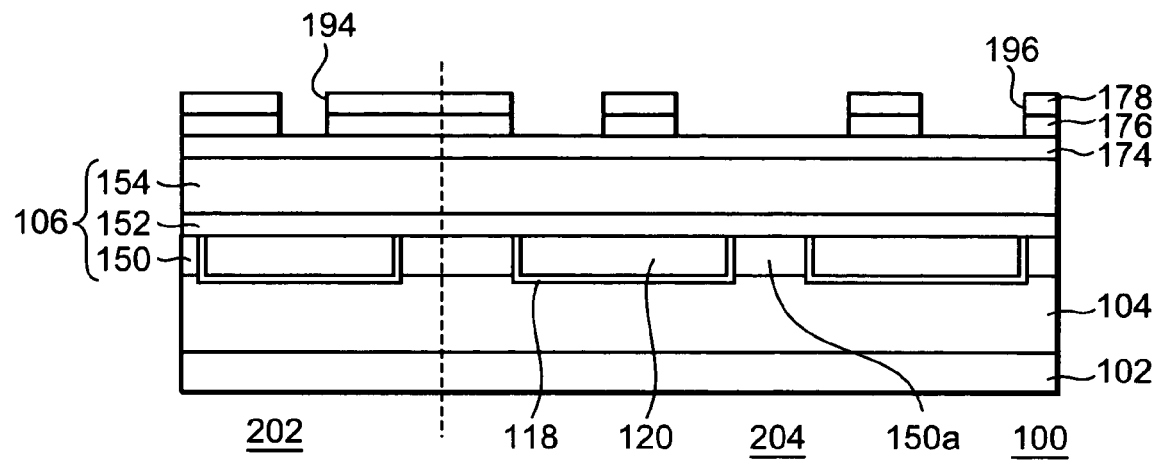
FIGS. 13A and 13B are process cross-sectional views of the another embodiment of a production procedure of the semiconductor device illustrated in FIG. 1.

While having the resist film 182 and the antireflection film 180 thus formed each serving as a mask, the third hard mask 178 and the second hard mask 176 are etched to form a via hole pattern 194 and an opening portion 196. Subsequently, the resist film 182 and the antireflection film 180 are removed by ashing and the like (FIG. 13A).

Figure 13B:
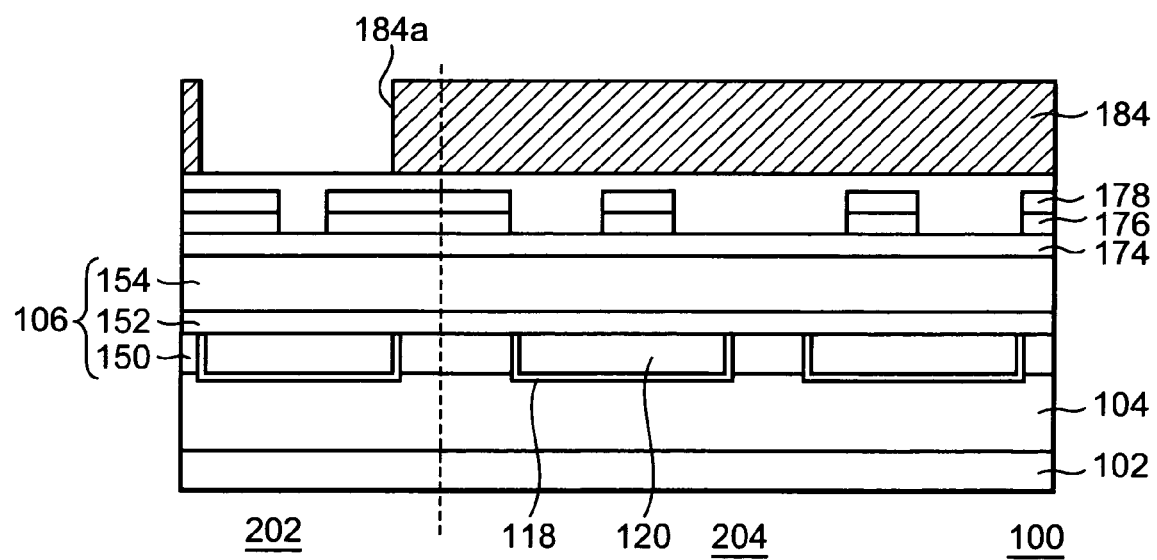
Figure 14A:
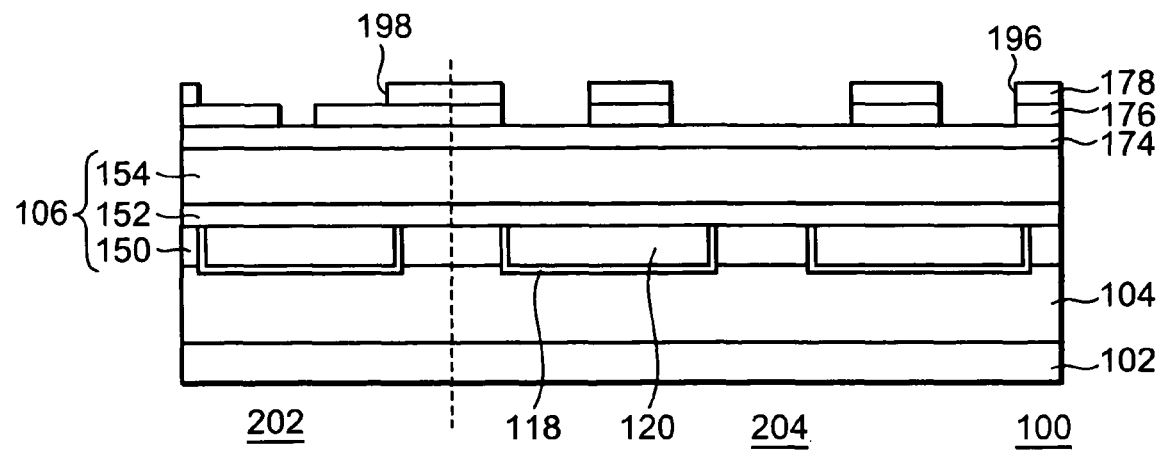
FIGS. 14A and 14B is process cross-sectional views of the another embodiment of a production procedure of the semiconductor device illustrated in FIG. 1.

Thereafter, an antireflection film 183 is formed on the entire surface of the first heard mask 174 and the third hard mask 178 so as to eliminate the level differences between these masks. Furthermore, on the antireflection film 183, a resist film 184 having a predetermined pattern is formed (FIG. 13B). In this case, in the chip interior 202, the resist 184 has an opening pattern provided by a pattern 184a corresponding to the wiring groove. In the meantime, in the seal ring part 204, the resist film 184 does not have an opening pattern. Accordingly, in the following etching process, the seal ring part 204 is not etched. Thereafter, while having the resist film 184 and the antireflection film 183 each serving as a mask, the third hard mask 178 in the chip interior 202 is etched to form a wiring groove pattern 198 (FIG. 14A).

Figure 14B:
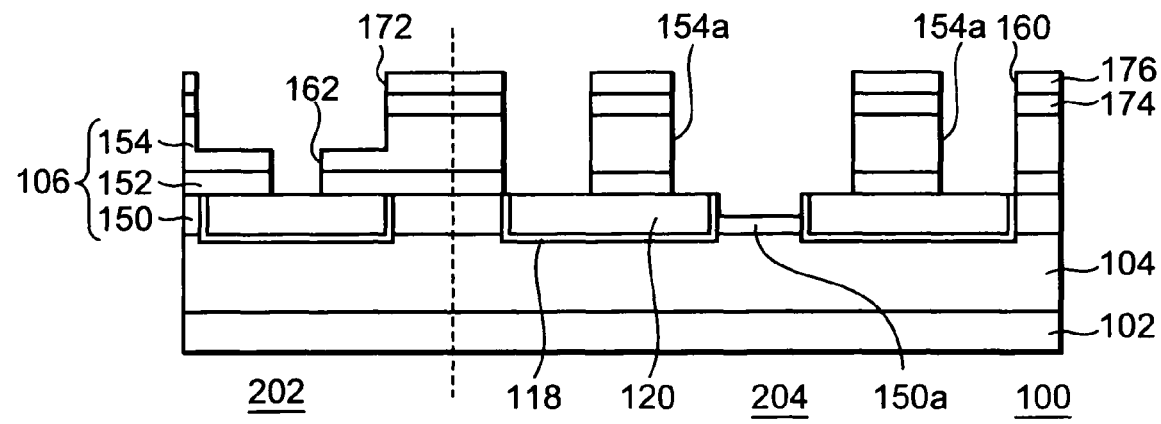

In the following process, firstly, while having the second hard mask 176 serving as a mask, the lower layer is etched. After etching to a predetermined depth, the lower layer is etched while having the third hard mask 178 serving as a mask. As a result, in the second interlayer insulating film 152 and the third interlayer insulating film 154, a dual damascene wiring groove (first groove) composed of a via hole 162 and a wiring groove 172 and a seal ring groove 160 (first seal ring groove) are formed in the chip interior 202 and the seal ring part 204, respectively (FIG. 14B). In this process, in the case where the copper-containing metal film 120 or the barrier metal film 118 is located under the second interlayer insulating film 152, the metal film serves as an etching prevention film. Thus, the etching stops when reaching the metal film. On the other hand, in the case where the first interlayer insulating film 150 (island-shape insulating film 150a) is located under the second interlayer insulating film 152, the first interlayer insulating film 150 is also etched after the second interlayer insulating film 152 has been removed by etching, and, as a result, a concave portion is formed in the through hole in the lower layer metal layer 121. In addition, in the seal ring groove 160, the second hard mask 176, the first hard mask 174, the third interlayer insulating film 154, and the second interlayer insulating film 152, which have not been removed by etching, provide multiple island-shape insulating films 154a formed in a staggered arrangement.

Figure 15A:
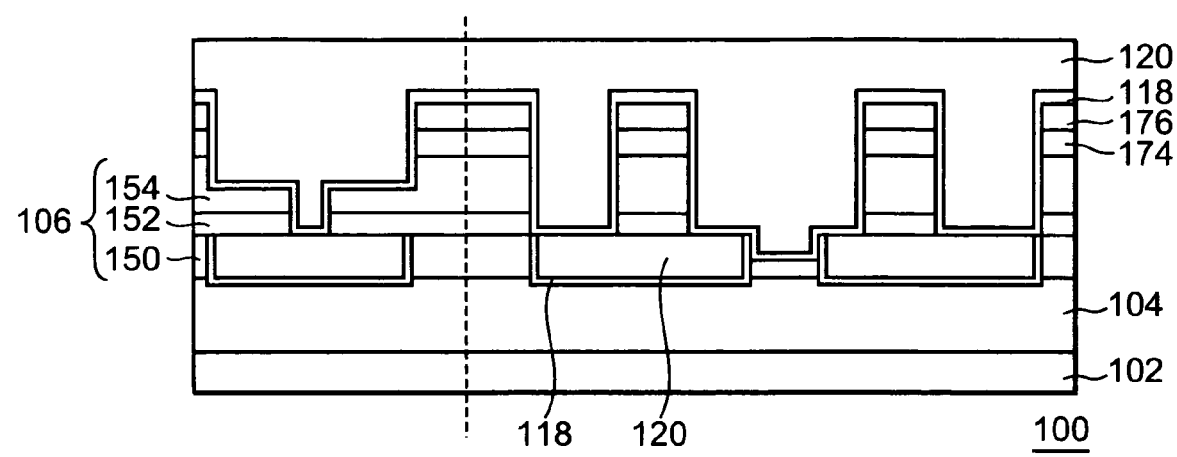
FIGS. 15A and 15b are process cross-sectional views of the another embodiment of a production procedure of the semiconductor device illustrated in FIG. 1.
Figure 15B:
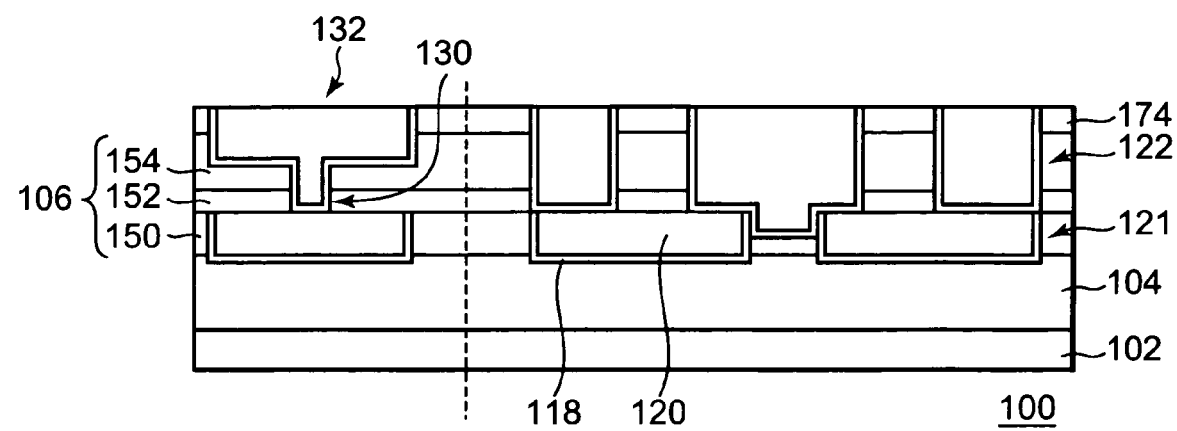

Subsequently, a barrier metal film 118 is formed on the entire upper surface of the substrate 102. As a result, the barrier metal film 118 is formed on: the inter wall of the wiring groove 172 and the via hole 162; the inner wall of the seal ring groove 160; the periphery of the island-shape insulating film 154a; and the inner wall of the upper part, in which the island-shape insulating film 150a is removed, of the through hole in the lower layer metal layer 121. Thereafter, a copper-containing metal film 120 is formed on the barrier metal film 118 so as to bury the wiring groove 172, the via hole 162, and the seal ring groove 160 into the copper-containing metal film 120 (FIG. 15A). Thereafter, the copper-containing metal film 120, the barrier metal film 118, and the second hard mask 176 are each removed in a part thereof exposed to the outside of the wiring groove 172 and the seal ring groove 160 by using CMP (FIG. 15B). In the CMP process, dishing can be prevented because the island-shape insulating film 154a has been formed in the seal ring groove 160.

Thereafter, by repeating the same procedure, the second metal layer 124 and a metal layer are sequentially stacked together on the first metal layer 122. As a result, in the seal ring part 204, a metal layer stacking structure can be obtained in which a downwardly-projecting convex portion on the individual metal layer is bulged into the upper part of the through hole formed in the lower layer metal layer.

Figure 16A:
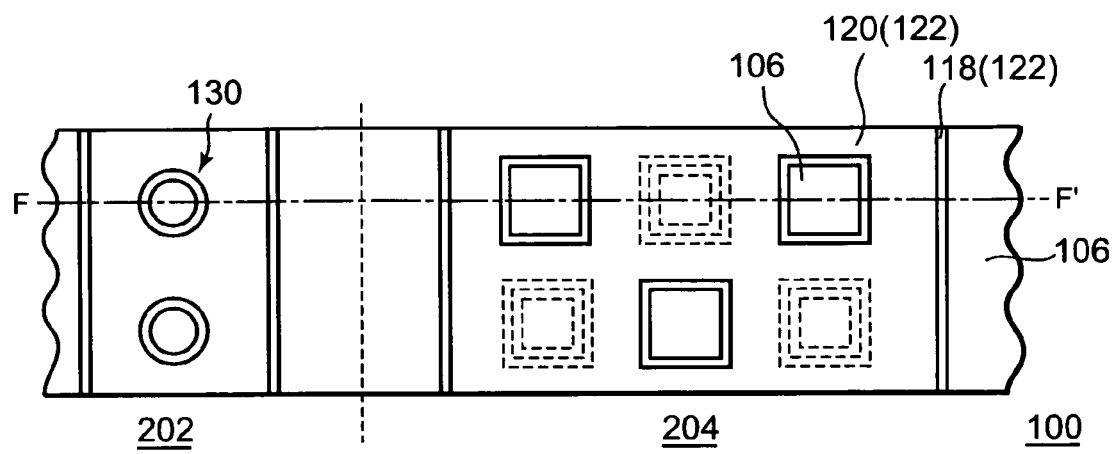
FIGS. 16A and 16B are drawings illustrating another exemplary embodiment of the semiconductor device according to the present invention.
Figure 16B:
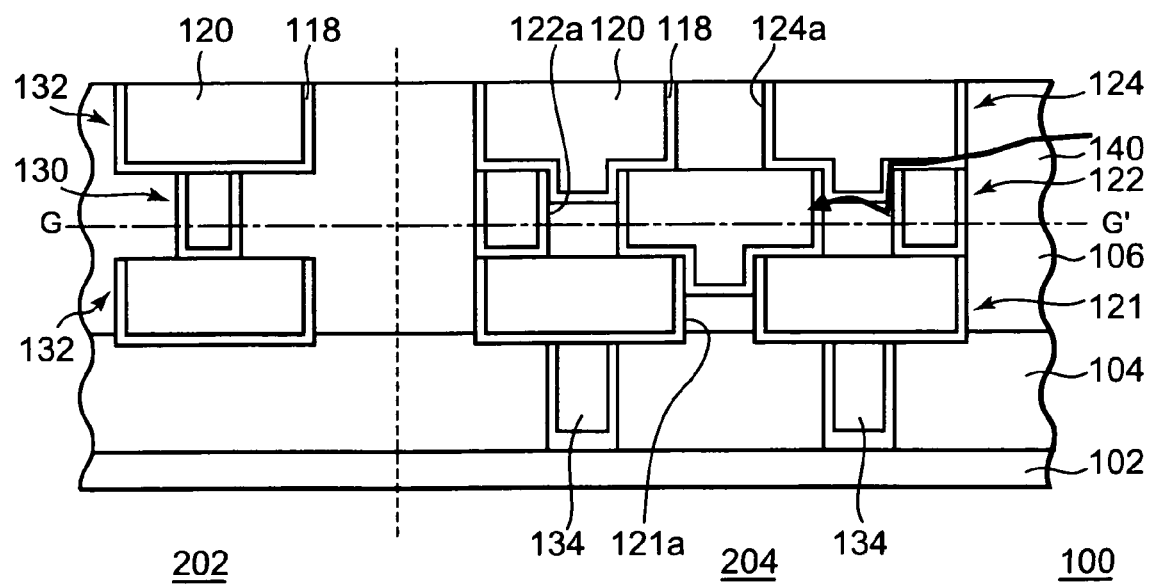

FIG. 16 is a drawing illustrating another exemplary embodiment of the semiconductor device 100 illustrated in FIG. 1. FIG. 16A is a lateral plan view of the semiconductor device 100, while FIG. 16B is a longitudinal front view of the semiconductor device 100. FIG. 16B corresponds to a cross-sectional view taken along the line F-F' of FIG. 16A, while FIG. 16A corresponds to a cross-sectional view taken along the line G-G' of FIG. 16B.

The present embodiment is different from the embodiment described by referring to FIG. 1 because the via layer 130 and the wiring layer 132 which are located in the chip interior 202 have a single damascene structure. In the present embodiment, in the seal ring part 204, the lower layer metal layer 121, the first metal layer 122, and the second metal layer 124 respectively have a thickness substantially equal to the thickness of the wiring layer 132, the via layer 130, and the wiring layer 132, which are located in the chip interior 202. To be more specific, the lower layer metal layer 121 has a thickness substantially equal to that of the wiring layer 132 in the chip interior 202. The first metal layer 122 has a thickness equal to that of the via layer 130 in the chip interior 202 except for the part in which the lower layer metal layer 121 is bulged into the through hole 121a. Likewise, The second metal layer 124 has a thickness equal to that of the wiring layer 132 in the chip interior 202 except for the part in which the first metal layer 122 is bulged into the through hole 122a. Accordingly, in the case where the via layer 130 and the wiring layer 132 which are located in the chip interior 202 have a thickness same as that of the via layer 130 and the wiring layer 132, respectively, in the semiconductor device 100 illustrated in FIG. 1, the lower layer metal layer 121, the first metal layer 122, and the second metal layer 124 in the semiconductor device 100 illustrated in FIG. 16 are thinner than the corresponding metal layers illustrated in FIG. 1.

Next, a description will be given of an exemplary embodiment of a production procedure of the semiconductor device 100 illustrated in FIG. 16. FIGS. 17 to 24 are each a process cross-sectional view illustrating the production procedure of the semiconductor device 100. In this case, in the same way as described above, an interlayer insulating film 106 is composed of a stacking structure of a first interlayer insulating film 150, a second interlayer insulating film 152, and a third interlayer insulating film 154.

Figure 17:
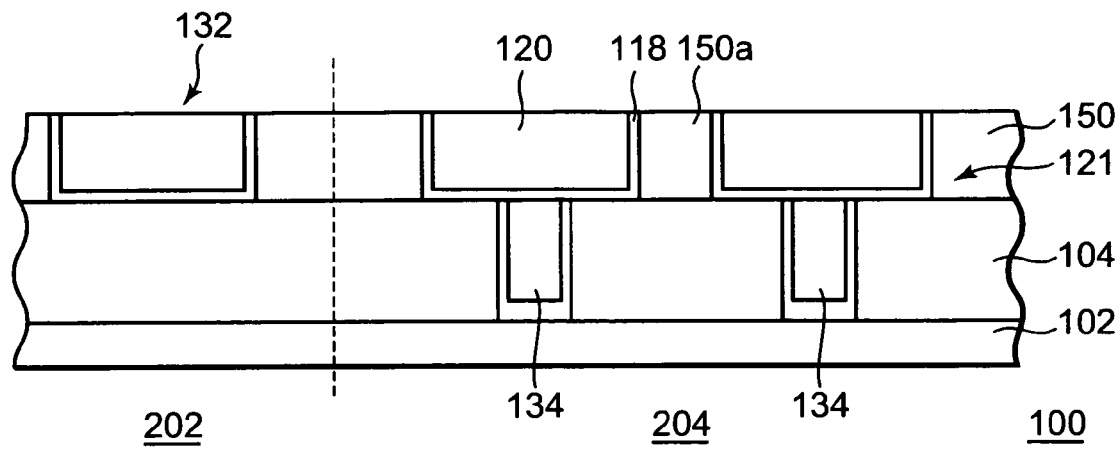
FIG. 17 is a process cross-sectional view illustrating a production procedure of the semiconductor device illustrated in FIG. 16.
Figure 18:
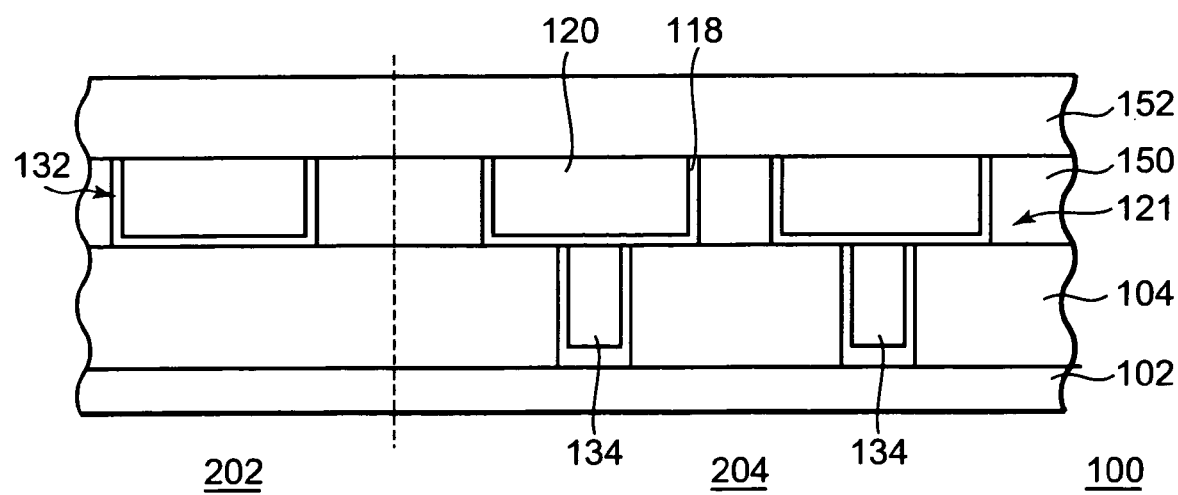
FIG. 18 is a process cross-sectional view illustrating a production procedure of the semiconductor device illustrated in FIG. 16.
Figure 19:
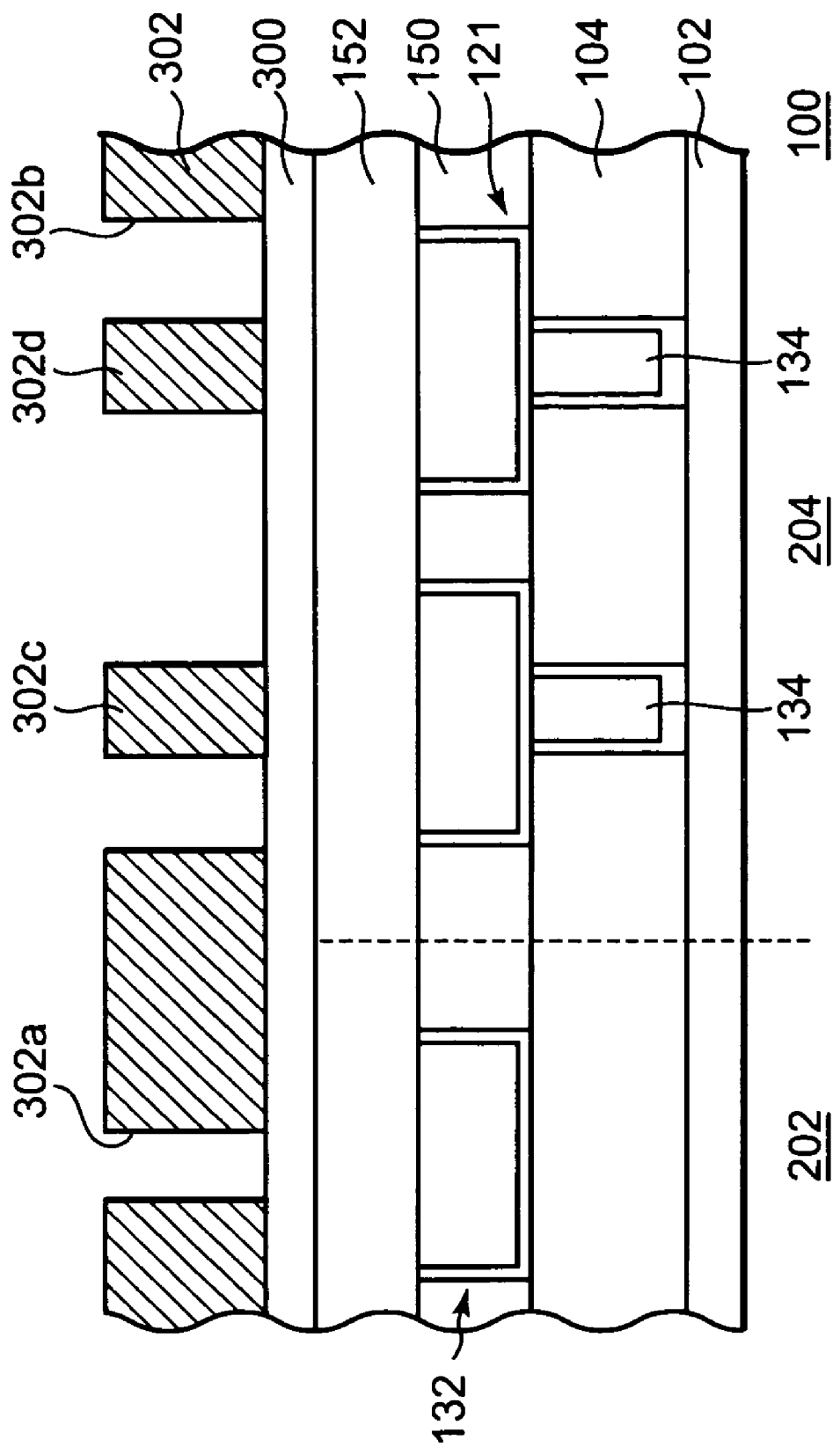
FIG. 19 is a process cross-sectional view illustrating a production procedure of the semiconductor device illustrated in FIG. 16.

Likewise in the description in reference to FIG. 4A, a wiring layer 132 and a lower layer metal layer 121 are formed in the first interlayer insulating film 150 (FIG. 17). Subsequently, the second interlayer insulating film 152 is formed on the entire surface of the first interlayer insulating film 150, the wiring layer 132, and the lower layer metal layer 121 which are located on the substrate 102 (FIG. 18). In this case, the second interlayer insulating film 152 may be configured to be the same low dielectric constant film as the first interlayer insulating film 150 and a third interlayer insulating film 154, which will be described later. Furthermore, on the second interlayer insulating film 152, an antireflection film 300 and a resist film 302 having a predetermined pattern are stacked together in this order (FIG. 19). At this point, the resist film 302 in the chip interior 202 has an opening pattern provided by a pattern 302a corresponding to the via hole. The resist film 302 in the seal ring part 204 has a pattern including: an opening provided by a pattern 302b corresponding a seal ring groove 306, which will be described later; and portions 302c and 302d left for masking an island-shape insulating film 152a, which will be described later, so that the island-shape insulating film 152a can be arranged to be dispersed in the seal ring groove 306.

Figure 20:
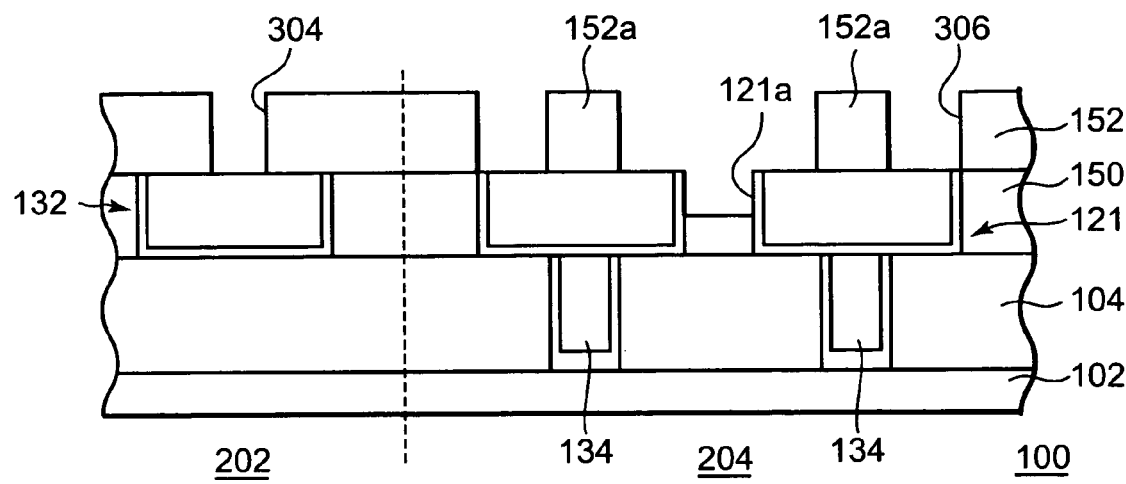
FIG. 20 is a process cross-sectional view illustrating a production procedure of the semiconductor device illustrated in FIG. 16.

While having the resist film 302 and the antireflection film 300 thus formed each serving as a mask, the second interlayer insulating film 152 is etched so as to form a via hole 304 (first groove) and a seal ring groove 306 (first seal ring groove). At this point, the island-shape insulating film 152a is formed in the seal ring groove 306. Thereafter, the resist film 302 and the antireflection film 300 are removed by ashing and the like (FIG. 20). At this point, in the case where the copper-containing metal film 120 or the barrier metal film 118 is located under the second interlayer insulating film 152, the metal film serves as an etching prevention film. Thus, the etching stops when reaching the metal film. On the other hand, in the case where the first interlayer insulating film 150 is located under the second interlayer insulating film 152, after the second interlayer insulating film 152 has been removed by etching, the first interlayer insulating film 150 in the through hole 121a is also etched. As a result, a concave portion is formed in the through hole 121a in the lower layer metal layer 121.

Figure 21:
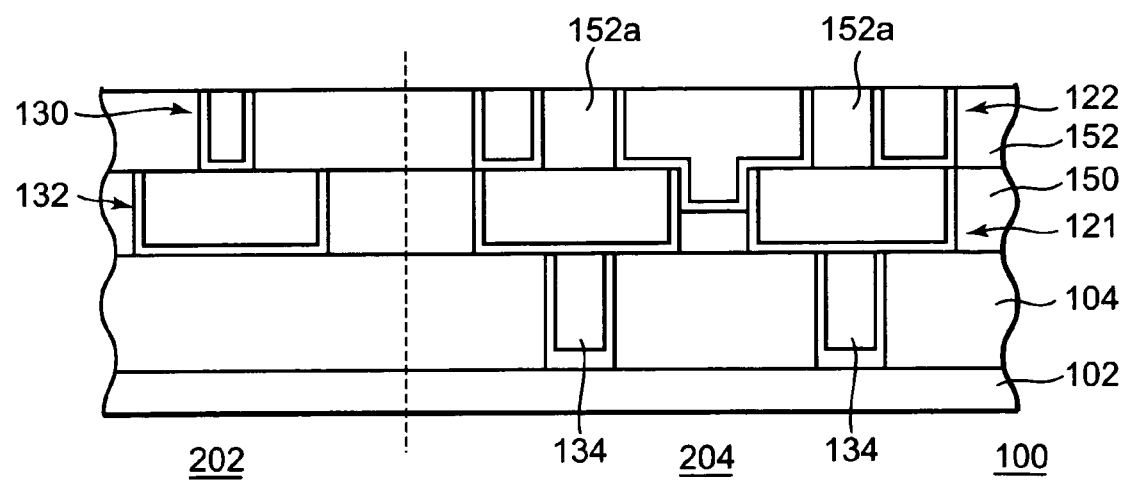
FIG. 21 is a process cross-sectional view illustrating a production procedure of the semiconductor device illustrated in FIG. 16.

Next, the barrier metal film 118 and the copper-containing metal film 120 are formed in this order on the entire upper surface of the substrate 102 so as to bury the via hole 304 and the seal ring groove 306 into the barrier metal film 118 and the copper-containing metal film 120. Thereafter, the copper-containing metal film 120 and the barrier metal film 118 are each removed in a part thereof exposed to the outside of the via hole 304 and the seal ring groove 306 by using CMP. As a result, the via layer 130 and the lower layer metal layer 121 are formed (FIG. 21). In the CMP process, dishing can be prevented because the island-shape insulating film 152a has been formed in the seal ring groove 306.

Figure 22:
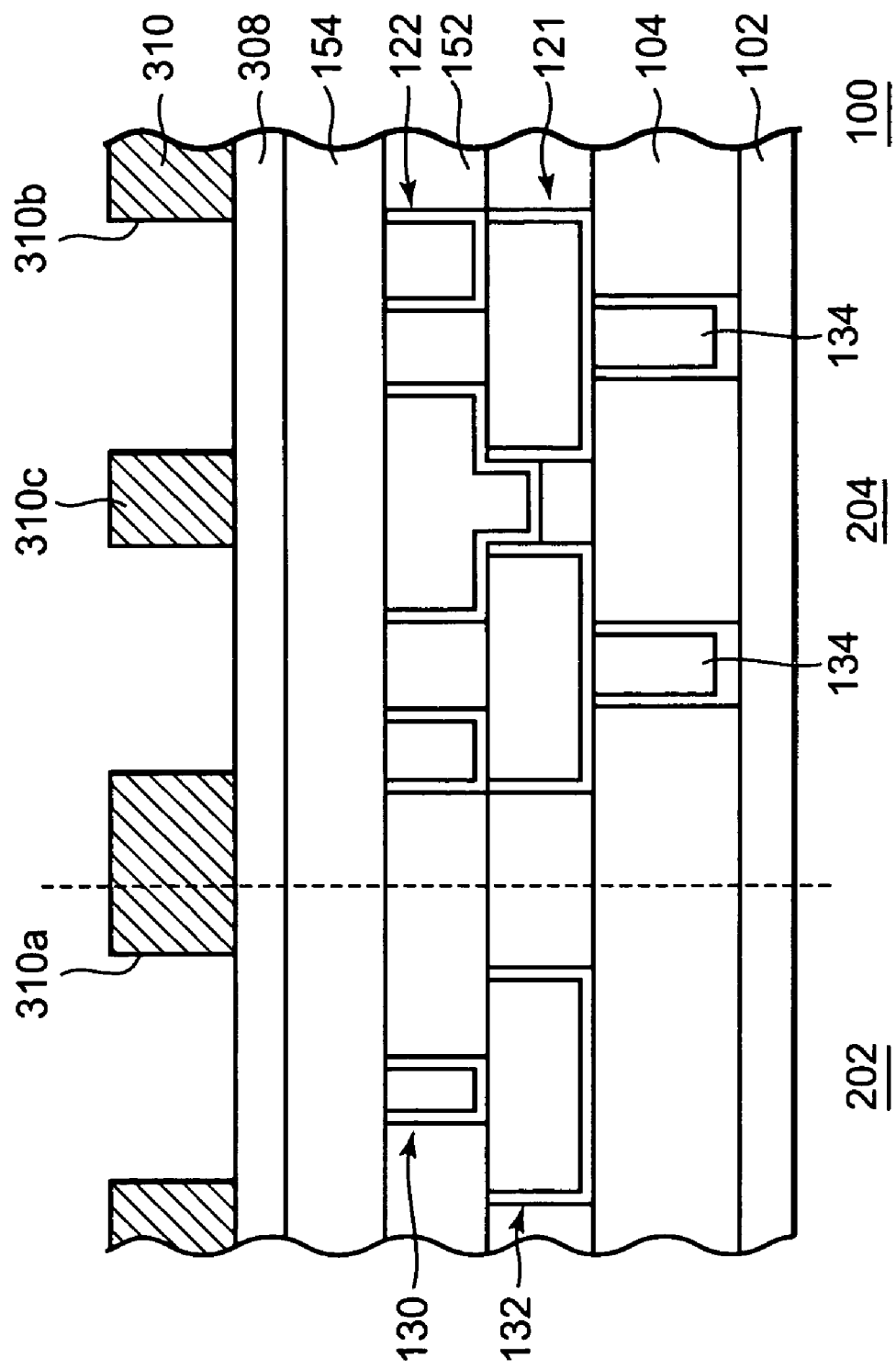
FIG. 22 is a process cross-sectional view illustrating a production procedure of the semiconductor device illustrated in FIG. 16.

Thereafter, the third interlayer insulating film 154, the antireflection film 308, and the resist film 316 having a predetermined pattern are stacked together in this order on the entire surface of the second interlayer insulating film 152, the via layer 130, and the first metal layer 122 which are located on the substrate 102 (FIG. 22). In this case, in the chip interior 202, the resist film 310 has an opening pattern provided by a pattern 310a corresponding to the wiring groove. In the seal ring part 204, the resist film 310 has a pattern including: an opening provided by a pattern 310b corresponding to a seal ring groove 314, which will be described later; and a portion 310c left for masking an island-shape insulation film 154a, which will be described later, so that the island-shape insulating film 154a can be arranged to be dispersed in the seal ring groove 314.

Figure 23:
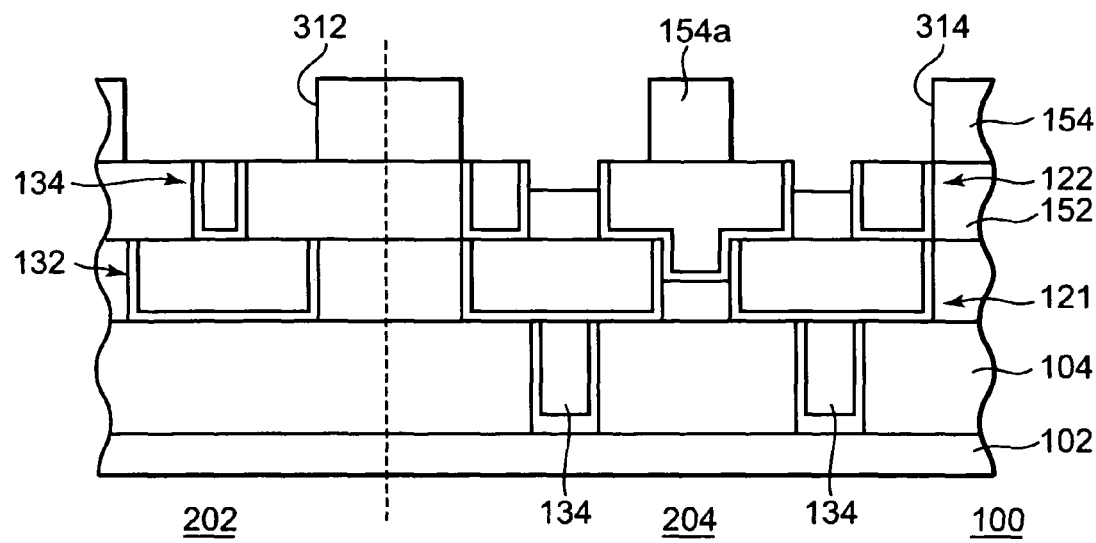
FIG. 23 is a process cross-sectional view illustrating a production procedure of the semiconductor device illustrated in FIG. 16.

While having the resist film 310 and the antireflection film 308 thus formed each serving as a mask, the third interlayer insulating film 154 is etched to form a wiring groove 312 (second groove) and a seal ring groove 314 (second seal ring groove). Subsequently, the resist film 310 and the antireflection film 308 are removed by ashing and the like (FIG. 23). In this process, in the case where the copper-containing metal film 120 or the barrier metal film 118 is located under the third interlayer insulating film 154, the metal film serves as an etching prevention film. Thus, the etching stops when reaching the metal film. In this case, since the seal ring groove 314 has a larger opening pattern than that of the wiring groove 312, the etching progresses fast in the seal ring groove 314. Accordingly, in the part where the second interlayer insulating film 152 is located under the third interlayer insulating film 154, after the third interlayer insulating film 154 has been removed by etching, the second interlayer insulating film 152 is etched. As a result, a concave part is formed in the through hole in the first metal layer 122.

Figure 24:
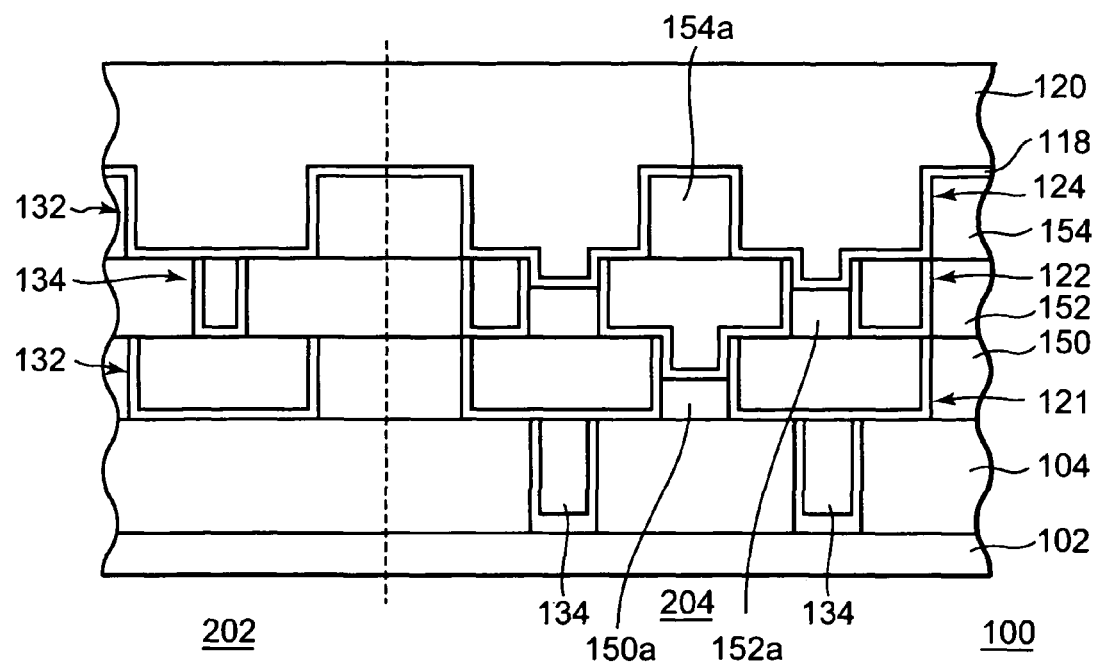
FIG. 24 is a process cross-sectional view illustrating a production procedure of the semiconductor device illustrated in FIG. 16.

Next, a barrier metal film 118 and a copper-containing metal film 120 are formed in this order on the entire upper surface of the substrate 102 so as to bury the writing groove 312 and the seal ring groove 314 into the barrier metal film 118 and the copper-containing metal film 120 (FIG. 24). Thereafter, the copper-containing metal film 120 and the barrier metal film 118 are each removed in a part thereof exposed to the outside of the wiring groove 312 and the seal ring groove 314 by using CMP. As a result, the wiring layer 132 and the second metal layer 124 are formed, and then a semiconductor device 100 having the structure illustrated in FIG. 16 is produced. In the CMP process, dishing can be prevented because the island-shape insulating film 154a has been formed in the seal ring groove 314.

By repeating the process described above, it is possible to produce a semiconductor device 100 having a configuration in which: a via layer 130 and a wiring 132 are further formed sequentially and alternately on the wiring layer 132; and a metal layer (third metal layer) having the same configuration as the first metal layer 122 and the second metal layer 124 is further formed sequentially and alternately on the second metal layer 124.

In the above section, the exemplary embodiments of the present invention have been described by referring to figures. However, these embodiments are exemplification of the present invention; thus, various configurations in addition to the above-described ones can be adopted.

The interlayer insulating film 106, the first interlayer insulating film 150, the second interlayer insulating film 152, the third interlayer insulating film 154, and the like which have been described in the above embodiments may be a stacking structure composed of a low dielectric constant film, an etching prevention film, a protection film, and the like. For example, it may be configured that a protection film is formed for protecting a low dielectric constant film during the CMP in the upper part of the low dielectric constant film.

In addition, the case in which the insulating material are arranged to be dispersed in an island shape in the metal layer in a plan view has been described in the above embodiments. However, it may be configured that the insulating material is formed in a slit shape extending in a longitudinal direction of the seal ring part 204. In such a configuration, in the same way as the configuration described in the embodiment, the metal layer has variations in levels in its bottom surface; thus, the progress of cracks and film detachment spreading in the through hole in the lower layer metal layer can be prevented.

Furthermore, in the case illustrated in FIG. 2, the island-shape insulating films arranged to be dispersed in the metal layer each have a substantially square shape. However, the island-shape insulating film may also have various shapes, such as a rectangular shape having a long side along a long-axis direction of the seal ring part 204, and a circular shape.

Further, it is noted that Applicant's intent is to encompass equivalents of all claim elements, even if amended later during prosecution.

What is claimed is:

1. A semiconductor device, comprising:
   a substrate;
   an element-forming region formed on the substrate, and having a via and a wiring formed therein; and
   a seal ring formed on the substrate, said seal ring being formed on an outer circumference of the element-forming region to surround the element-forming region, the seal ring including a first metal layer having a through hole formed therein to surround the element-forming region, and a second metal layer formed on the first metal layer to be in contact with the first metal layer, wherein, in the through hole in the first metal layer, a lower part thereof is provided with an insulating material formed thereon, and an upper part, that is not provided with the insulating material formed thereon, is provided with a metal material, which constitutes the second metal layer, formed to project into the upper part, and wherein in an entire region of the through hole, the upper part of the through hole is provided with the metal material.

2. The semiconductor device according to claim 1, wherein the through hole in the first metal layer comprises a plurality of through holes arranged to be dispersed to surround the element-forming region, and wherein in each of the plurality of through holes, a lower part thereof is provided with the insulating material formed thereon, and the upper part, that is not provided with the insulating material formed thereon, is provided with the second metal layer formed to project into the upper part.

3. The semiconductor device according to claim 2, wherein the plurality of through holes in the first metal layer are arranged in a grid pattern.

4. The semiconductor device according to claim 1, wherein the seal ring further includes, on the second metal layer, a third metal layer formed to be in contact with the second metal layer, wherein the second metal layer includes a through hole formed, in a part not overlapping with any through hole in the first metal layer, to surround the element-forming region, and wherein in the through hole of the second metal layer, a lower part thereof is provided with an insulating material formed thereon, and an upper part, that is not provided with the insulating material formed thereon, is provided with a metal material, which constitutes the third metal layer, formed to project into the upper part.

5. The semiconductor device according to claim 4, wherein the through hole in the second metal layer comprises a plurality of through holes arranged to be dispersed so as to surround the element-forming region, and wherein in each of the plurality of through holes, a lower part thereof is provided with the insulating material formed thereon, and an upper part that is not provided with the insulating material formed thereon is provided with the third metal layer formed to project into the upper part.

6. The semiconductor device according to claim 5, wherein the plurality of through holes in the second metal layer are arranged in a grid pattern.

7. The semiconductor device according to claim 4; wherein:

the seal ring further includes, under the first metal layer, a lower layer metal layer formed to be in contact with the first metal layer; and the seal ring has, in a cross-section taken along a straight line extending from an inner circumference to an outer circumference thereof, a configuration in which the insulating material is arranged to be dispersed in an island shape in metal materials respectively constituting the lower layer metal layer, the first metal layer, the second metal layer, and the third metal layer.

8. The semiconductor device according to claim 4, wherein:

the seal ring, in a cross-section taken along a straight line extending from an inner circumference to an outer circumference thereof, has a row having the through hole in the first metal layer formed thereon and a row having the through hole in the second metal layer formed thereon being alternately arranged in a direction from the inner circumference to the outer circumference.

9. The semiconductor device according to claim 1, wherein an upper surface of the metal material, in the upper part of the through hole contacts a lower surface of the second metal layer.

10. The semiconductor device according to claim 1, wherein, in said entire region of the through hole, the insulating material of the lower part of the through hole contacts side surfaces of the metal material in the upper part of the through hole.

11. The semiconductor device according to claim 1, further comprising an interlayer insulating film, said first metal layer being disposed in the interlayer insulating film, wherein the interlayer insulating film comprises the insulating material of the lower part of the through hole.

12. A semiconductor device including a seal ring structure, said seal ring structure comprising:

a first metal layer including a through hole, said through hole having a bottom portion filled with an insulating material; and a second metal layer formed on said first metal layer, said second metal layer having a projected portion projecting from a bottom of said second metal layer, said projected portion being inserted into a top portion of said through hole, wherein in an entire region of the through hole, the projected portion is inserted into the top portion of said through hole.

13. The semiconductor device as claimed in claim 12, wherein:

said first metal layer includes a plurality of said through holes; and said second metal layer has a plurality of projected portions, said plurality of projected portions being inserted into top portions of said plurality of through holes.

14. The semiconductor device as claimed in claim 12, said seal ring structure further comprising:

a third metal layer formed under said first metal layer, said third metal layer having a through hole, wherein said first metal layer includes a projected portion projecting from a bottom of said first metal layer, said projected portion of said first metal layer being inserted into said through hole of said third metal layer.

15. The semiconductor device according to claim 12, wherein the top portion of said through hole is filled with a metal material.

* * * * *